US006985048B2

(12) United States Patent
Takamine et al.

(10) Patent No.: US 6,985,048 B2
(45) Date of Patent: Jan. 10, 2006

(54) SURFACE ACOUSTIC WAVE APPARATUS AND COMMUNICATION APPARATUS

(75) Inventors: Yuichi Takamine, Kanazawa (JP); Teruhisa Shibahara, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 3 days.

(21) Appl. No.: 10/652,950

(22) Filed: Aug. 29, 2003

(65) Prior Publication Data

US 2004/0080385 A1 Apr. 29, 2004

(30) Foreign Application Priority Data

Aug. 29, 2002 (JP) ....................................... 2002-251950

(51) Int. Cl.
*H03H 9/64* (2006.01)
*H03H 9/72* (2006.01)

(52) U.S. Cl. ....................... 333/133; 333/193; 333/195; 333/196; 310/313 B

(58) Field of Classification Search ......... 333/193–196, 333/133; 310/313 B, 313 D
See application file for complete search history.

(56) References Cited

U.S. PATENT DOCUMENTS 6,720,842 B2 * 4/2004 Sawada ...................... 333/133
6,791,437 B2 * 9/2004 Hagn et al. ................. 333/195
6,809,614 B2 * 10/2004 Fujii et al. .................. 333/193
2002/0145361 A1 * 10/2002 Shibata et al. .......... 310/313 C
2003/0001695 A1 * 1/2003 Nakamura et al. .......... 333/193
2003/0035557 A1 * 2/2003 Takamine et al. ........... 381/111
2003/0201846 A1 * 10/2003 Nakamura et al. .......... 333/193

FOREIGN PATENT DOCUMENTS

| | | |
|---|---|---|
| DE | 198 18 826 | * 11/1999 |
| JP | 11-097966 | 4/1999 |
| WO | WO 01/71911 | * 9/2001 |

* cited by examiner

*Primary Examiner*—Barbara Summons
(74) *Attorney, Agent, or Firm*—Keating & Bennett, LLP

(57) ABSTRACT

A longitudinally-coupled-resonator-type surface acoustic wave filter includes three interdigital transducers provided on a piezoelectric substrate in the direction in which surface acoustic waves propagate. An interdigital transducer disposed at the approximate center among the three interdigital transducers of the longitudinally-coupled-resonator-type surface acoustic wave filter is divided into two parts substantially symmetrically in the propagation direction of the surface acoustic waves and the two parts are connected to balanced signal terminals, respectively. Left and right interdigital transducers of which the polarities are inverted relative to each other are connected to an unbalanced signal terminal to provide a balanced-to-unbalanced conversion function. A reactance component provided on the piezoelectric substrate, inside a package, or outside the package is connected to either of the balanced signal terminals.

22 Claims, 31 Drawing Sheets

SURFACE ACOUSTIC WAVE APPARATUS AND COMMUNICATION APPARATUS

BACKGROUND OF THE INVENTION

1. Field of the Invention

The present invention relates to surface acoustic wave apparatuses including a surface acoustic wave filter having a balanced-to-unbalanced conversion function.

2. Description of the Related Art

Remarkable technical progress has been made on portable telephones (communication apparatuses) in terms of their compactness and light weight. To achieve this, the number of components has been reduced, the size of components has been reduced, and components having a plurality of functions have been developed.

Surface acoustic wave apparatuses having a balanced-to-unbalanced conversion function, a so-called balun function, used in RF stages of portable telephones have been actively researched, and have been primarily used in global systems for mobile communications (GSMs).

Several patent applications relating to surface acoustic wave apparatuses having a balanced-to-unbalanced conversion function have been filed. FIG. 3 shows a surface acoustic wave apparatus having a balanced-to-unbalanced conversion function with the impedance of an unbalanced signal terminal side set to 50 Ω and the impedance of a balanced signal terminal side set to 200Ω, which is disclosed in Japanese Unexamined Patent Publication No. JP 11-97966.

In the structure of FIG. 3, in a longitudinally-coupled-resonator-type surface acoustic wave filter 301 in which three interdigital transducers (hereinafter called IDTs) are arranged in direction in which surface acoustic waves propagate, an IDT 303 disposed at the center is divided into two portions substantially symmetrically in the propagation direction of the surface acoustic waves, and the two portions are connected to balanced signal terminals 308 and 309, and left and right IDTs 302 and 304 having inverted polarities are connected to an unbalanced signal terminal 307. With this structure, a balanced-to-unbalanced conversion function is provided by the inverted polarities, and the impedance at the balanced signal terminal side is about four times as high as that of the unbalanced signal terminal side by the division of the IDT 303 into the two portions.

Filters having a balanced-to-unbalanced conversion function must have equal amplitude characteristics and phases that are inverted by 180 degrees in the transfer characteristics at a pass band between an unbalanced signal terminal and balanced signal terminals. They are called an amplitude-balance degree and a phase-balance degree.

The amplitude-balance degree and the phase-balance degree are defined in the following manner assuming that filter apparatuses having a balanced-to-unbalanced conversion function are three-port devices. The amplitude-balance degree=$|A|$, $A=|20\log(S21)|-|20\log(S31)|$, the phase-balance degree=$|B-180|$, $B=|\angle S21-\angle S31|$, where an unbalanced input terminal is called port 1, and balanced output terminals are called port 2 and port 3. Ideally, the amplitude-balance degree should be 0 dB and the phase balance degree should be 0 degrees in the pass band of surface acoustic wave filters.

However, the balance degrees of the conventional structure shown in FIG. 3 are insufficient. This is because the electrode fingers (310 and 317 in FIG. 3) of the IDT 302 and the IDT 304, adjacent to the IDT 303 have different polarities from each other, and therefore, parasitic capacitances and bridging capacitances differ at the balanced signal terminals 308 and 309.

SUMMARY OF THE INVENTION

To overcome the problems described above, preferred embodiments of the present invention provide a surface acoustic wave apparatus which has a balanced-to-unbalanced conversion function with improved balance degrees and in which the impedance of balanced signal terminals are about four times greater than that of an unbalanced signal terminal.

One preferred embodiment of the present invention provides a surface acoustic wave apparatus including a longitudinally-coupled-resonator-type surface acoustic wave filter in which an odd number of three or more interdigital transducers are provided on a piezoelectric substrate in the direction in which surface acoustic waves propagate, one interdigital electrode of an interdigital transducer disposed at the center among the odd number of interdigital transducers is divided into two parts along the propagation direction of the surface acoustic waves and the two parts are connected to balanced signal terminals, respectively, and two interdigital transducers adjacent to the interdigital transducer disposed at the center are inverted with respect to each other and are connected to an unbalanced signal terminal to provide a balanced-to-unbalanced conversion function, wherein an outermost electrode finger of the interdigital transducer disposed at the center is a floating electrode or a grounded electrode, and wiring is provided asymmetrically such that a balanced signal terminal closer to an interdigital transducer, of which an outermost electrode finger adjacent to the interdigital transducer disposed at the center is grounded of the two interdigital transducers adjacent to the interdigital transducer disposed at the center has a larger capacitance.

According to the above-described structure, since the wiring is provided asymmetrically such that a balanced signal terminal closer to an interdigital transducer, of which an outermost electrode finger adjacent to the interdigital transducer disposed at the center is grounded, of the two interdigital transducers adjacent to the interdigital transducer disposed at the center has a larger capacitance, balance degrees between the balanced signal terminals, especially the phase balance degree, is greatly improved.

Another preferred embodiment of the present invention provides a surface acoustic wave apparatus including a longitudinally-coupled-resonator-type surface acoustic wave filter in which an odd number of three or more of interdigital transducers are provided on a piezoelectric substrate in the direction in which surface acoustic waves propagate, one interdigital electrode of an interdigital transducer disposed at the center among the odd number of interdigital transducers is divided into two parts in the propagation direction of the surface acoustic waves arid the two parts are connected to balanced signal terminals, respectively, and two interdigital transducers adjacent to the interdigital transducer disposed at the center are inverted with respect to each other and are connected to an unbalanced signal terminal to provide a balanced-to-unbalanced conversion function, wherein an outermost electrode finger of the interdigital transducer disposed at the center is a signal electrode, and wiring is provided asymmetrically such that a balanced signal terminal closer to an interdigital transducer, of which an outermost electrode finger adjacent to the interdigital transducer disposed at the center is a signal electrode, of the two interdigital transducers adjacent to the interdigital transducer disposed at the center has a larger capacitance.

According to the above-described structure, since the wiring is provided asymmetrically such that a balanced signal terminal closer to an interdigital transducer, of which an outermost electrode finger adjacent to the interdigital transducer disposed at the center is a signal electrode, of the two interdigital transducers adjacent to the interdigital transducer disposed at the center has a larger capacitance, balance degrees between the balanced signal terminals, especially the phase balance degree, is greatly improved.

The above-described surface acoustic wave apparatus is preferably configured such that the piezoelectric substrate is mounted on a package by flip-chip bonding, and the asymmetrical wiring is provided on the package.

In the above-described surface acoustic wave apparatus, wiring on the piezoelectric substrate and on the package is preferably substantially symmetrical about a virtual axis that is substantially perpendicular to the propagation direction of the surface acoustic waves at the center of the interdigital transducer located at the center, except the asymmetrical wiring.

Still another preferred embodiment of the present invention provides a surface acoustic wave apparatus including a longitudinally-coupled-resonator-type surface acoustic wave filter in which an odd number of three or more of interdigital transducers are provided on a piezoelectric substrate in the direction in which surface acoustic waves propagate, one interdigital electrode of an interdigital transducer disposed at the center among the odd number of interdigital transducers is divided into two parts in the propagation direction of the surface acoustic waves and the two parts are connected to balanced signal terminals, respectively, and two interdigital transducers adjacent to the interdigital transducer disposed at the center are inverted with respect to each other and are connected to an unbalanced signal terminal to provide a balanced-to-unbalanced conversion function, wherein an outermost electrode finger of the interdigital transducer disposed at the center is a floating electrode or a grounded electrode, and a reactance component or a delay line is added to a balanced signal terminal closer to an interdigital transducer, of which an outermost electrode finger adjacent to the interdigital transducer disposed at the center is grounded, of the two interdigital transducers adjacent to the interdigital transducer disposed at the center.

According to the above-described structure, since the reactance component or the delay line is added to a balanced signal terminal closer to an interdigital transducer, of which an outermost electrode finger adjacent to the interdigital transducer disposed at the center is grounded, balance degrees between the balanced signal terminals, especially the phase balance degree, is greatly improved.

Yet another preferred embodiment of the present invention provides a surface acoustic wave apparatus including a longitudinally-coupled-resonator-type surface acoustic wave filter in which an odd number of three or more of interdigital transducers are provided on a piezoelectric substrate in the direction in which surface acoustic waves propagate, one interdigital electrode of an interdigital transducer disposed at the center among the odd number of interdigital transducers is divided into two parts in the propagation direction of the surface acoustic waves and the two parts are connected to balanced signal terminals, respectively, and two interdigital transducers adjacent to the interdigital transducer disposed at the center are inverted with respect to each other and are connected to an unbalanced signal terminal to provide a balanced-to-unbalanced conversion function, wherein an outermost electrode finger of the interdigital transducer disposed at the center is a signal electrode, and a reactance component or a delay line is added to a balanced signal terminal closer to an interdigital transducer, of which an outermost electrode finger adjacent to the interdigital transducer disposed at the center is a signal electrode, of the two interdigital transducers adjacent to the interdigital transducer disposed at the center.

According to the above-described structure, since an outermost electrode finger of the interdigital transducer disposed at the center is a signal electrode, and the reactance component or the delay line is added to a balanced signal terminal closer to the interdigital transducer, of which an outermost electrode finger adjacent to the interdigital transducer disposed at the center is a signal electrode, of the two interdigital transducers adjacent to the interdigital transducer disposed at the center, balance degrees between the balanced signal terminals, especially the phase balance degree, is greatly improved.

The above-described surface acoustic wave apparatus is preferably configured such that the piezoelectric substrate is mounted on a package by flip-chip bonding, and the reactance component or the delay line is provided on the package.

In the above-described surface acoustic wave apparatus, wiring on the piezoelectric substrate and on the package is preferably substantially symmetrical about a virtual axis that is substantially perpendicular to the propagation direction of the surface-acoustic waves at the center of the interdigital transducer disposed at the center, except for the reactance component or the delay line.

The above-described surface acoustic wave apparatus may be configured such that the reactance component is a capacitance component, and is connected in parallel between the balanced signal terminal and a ground potential. Alternatively, the above-described surface acoustic wave apparatus may be configured such that the reactance component is an inductance component, and is connected in series to the balanced signal terminal.

In the above-described surface acoustic wave apparatus, a surface acoustic wave resonator may be added in series and/or in parallel to the surface acoustic wave filter. In the above-described surface acoustic wave apparatus, a plurality of the surface acoustic wave filters may be connected in cascade to each other. In the above-described surface acoustic wave apparatus, the total number of the electrode fingers of the surface acoustic wave filters connected in cascade is preferably an even number.

In the above-described surface acoustic wave apparatus, the interdigital transducers that are arranged at both ends of each of the surface acoustic wave filters are preferably connected in cascade to each other and connected to interdigital transducers arranged at both ends by signal lines, and the phases of signals passing through the signal lines are preferably different by about 180 degrees.

In the above-described surface acoustic wave apparatus, an electrode finger of at least one interdigital transducer of adjacent interdigital transducers, close to the boundary of the interdigital transducers is preferably weighted in the surface acoustic wave filter. In the above-described surface acoustic wave apparatus, the weighting is preferably performed by series weighting.

The above-described surface acoustic wave apparatus is preferably configured such that the piezoelectric substrate is mounted on a package by flip-chip bonding, the package includes six external terminals, one unbalanced signal terminal, two balanced signal terminals, and three ground terminals, and the six terminals are arranged substantially symmetrically about a virtual axis that is substantially perpendicular to the propagation direction of the surface acoustic waves at the center of the interdigital transducer positioned at the center of the surface acoustic wave filter.

The above-described surface acoustic wave apparatus is preferably configured such that the piezoelectric substrate is mounted on a package by flip-chip bonding, the package has five external terminals, one unbalanced signal terminal, two balanced signal terminals, and two ground terminals, and the five terminals are arranged substantially symmetrically about a virtual axis that is substantially perpendicular to the propagation direction of the surface acoustic waves at the center of the interdigital transducer positioned at the center of the surface acoustic wave filter.

Still yet another preferred embodiment of the present invention provides a communication apparatus including the surface acoustic wave apparatus according to one of the preferred embodiments described above. Since the communication apparatus includes the surface acoustic wave apparatus according to the above-described preferred embodiments, which have superior balance degrees, the communication apparatus has greatly improved communication characteristics.

As described above, a surface acoustic wave apparatus according to various preferred embodiments of the present invention is a longitudinally-coupled-resonator-type surface acoustic wave filter in which three IDTs are provided on a piezoelectric substrate in the direction in which surface acoustic waves propagate. In the surface acoustic wave apparatus, an IDT disposed at the center among the three IDTs is divided into two parts substantially symmetrically in the propagation direction of the surface acoustic waves, the two parts are connected to balanced signal terminals, and left and right IDTs of which the polarities are inverted to each other are connected to unbalanced signal terminals to provide a balanced-to-unbalanced conversion function. A reactance component is connected to either of the balanced signal terminals by at least one of being on the piezoelectric substrate, in the package, and through an external connection to the package.

Therefore, the above-described structure provides greatly improved balance degrees between the balanced signal terminals when a reactance component is connected to either of the balanced signal terminals.

The above and other elements, characteristics, features, and advantages of the present invention will become clear from the following description of preferred embodiments taken in conjunction with the accompanying drawings.

BRIEF DESCRIPTION OF THE DRAWINGS

FIG. 31A is a view of a case in which a circuit serving as the reactance component or the delay line is formed between a bottom plate and a side wall section, and FIG. 31B is a view of a case in which the reactance component or the delay line is formed as a circuit in a multi-layer substrate in which a lamination plate is formed on the bottom plate.

DETAILED DESCRIPTION OF PREFERRED EMBODIMENTS

Figure 1:
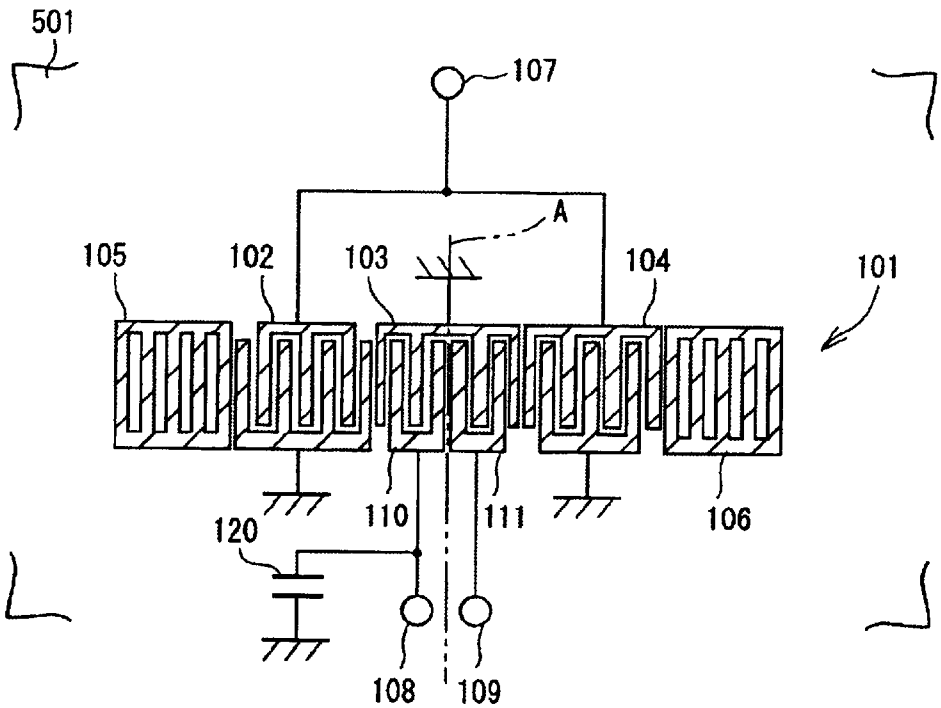
FIG. 1 is a structural view of a surface acoustic wave apparatus according to a preferred embodiment of the present invention.

A surface acoustic wave apparatus according to a preferred embodiment of the present invention will be described below by referring to FIG. 1. The surface acoustic wave apparatus according to a preferred embodiment of the present invention includes, as shown in FIG. 1, a longitudinally-coupled-resonator-type surface acoustic wave filter 101 in which three IDTs are provided on a piezoelectric substrate 501 in the direction in which surface acoustic waves propagate. An IDT 103 which is disposed at the center among the three IDTs of the longitudinally-coupled-resonator-type surface acoustic wave filter 101 is divided into two parts substantially symmetrically in the propagation direction of the surface acoustic waves and the two parts are connected to balanced signal terminals 108 and 109, respectively. The left and right IDTs 102 and 104 of which the polarities are inverted relative to each other are connected to an unbalanced signal terminal 107 to provide a balanced-to-unbalanced conversion function. The surface acoustic wave apparatus includes a reactance component 120 which is provided on the piezoelectric substrate, provided on a package, or externally connected to the package and which is connected to either of the balanced signal terminals 108 and 109.

With the above-described structure, the surface acoustic wave apparatus has the balanced-to-unbalanced conversion function, and the impedance of the balanced signal terminals is about four times that of the unbalanced signal terminal. In addition, the balance degrees thereof are greatly improved by the reactance component 120.

First Preferred Embodiment

A first preferred embodiment according to the present invention will be described with reference to FIG. 4 to FIG. 7. In the following preferred embodiment, a DCS receiving filter will be described as an example. An electrode structure in the first preferred embodiment will be described first with reference to FIG. 4. In the first preferred embodiment, a longitudinally-coupled-resonator-type surface acoustic wave filter 401 and a surface acoustic wave resonator 402 connected in series to the longitudinally-coupled-resonator-type surface acoustic wave filter 401 are defined by aluminum (Al) electrodes provided on a piezoelectric substrate 501 preferably made from 40±5-degree Y-cut X-propagation $LiTaO_3$.

In the longitudinally-coupled-resonator-type surface acoustic wave filter 401, IDTs 403 and 405 are arranged so as to sandwich an IDT 404 on both sides in direction in which surface acoustic waves propagate, and reflectors 406 and 407 are arranged so as to sandwich the IDTs 403, 404 and 405.

The IDT 403 includes two interdigital electrodes each of which is defined by a strip-shaped base end section (bus bar) and a plurality of parallel electrode fingers extending from one side of the base end section, substantially perpendicular to the base end section. The interdigital electrodes are engaged with each other between their electrode fingers such that the sides of electrode fingers of the interdigital electrodes face each other.

The signal conversion characteristics and the pass band of the IDT 403 is specified by setting the length and width of each electrode finger, the distance between adjacent electrode fingers, and an overlap width indicating the length of the portions facing each other when the interdigital electrodes are engaged. The other IDTs have the same basic structure as the IDT 403. The reflectors reflect propagating surface acoustic waves in opposite direction to those in which the waves have propagated.

Figure 4:
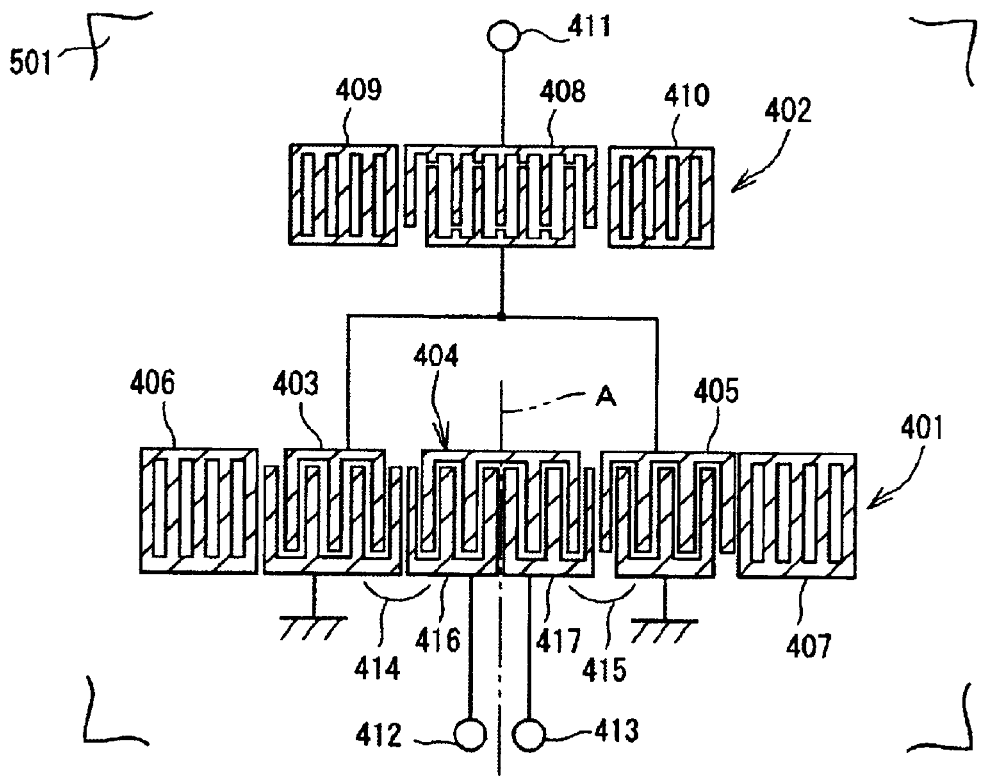
FIG. 4 is a structural view showing the electrode structure of a surface acoustic wave apparatus according to a first preferred embodiment of the present invention.

In the above-described structure, as understood from FIG. 4, the pitches of several electrode fingers (portions 414 and 415 in FIG. 4) in vicinities of the boundary between the IDT 403 and the IDT 404 and the boundary between the IDT 404 and the IDT 405 are preferably less than that of the other electrode fingers of the IDTs.

One interdigital electrode of the IDT 404, disposed at the center, is divided into sub-interdigital electrodes 416 and 417 in the propagation direction of surface acoustic waves, and the sub-interdigital electrodes 416 and 417 are connected to balanced signal terminals 412 and 413, respectively. In the first preferred embodiment, the other interdigital electrode of the IDT 404, facing the sub-interdigital electrodes 416 and 417, is a floating electrode. Alternatively, it may be a grounded electrode. The IDT 405 has a phase that is inverted relative to that of the IDT 403. With this structure, the surface acoustic wave filter has a balanced-to-unbalanced conversion function.

In the surface acoustic wave resonator 402, reflectors 409 and 410 are provided so as to sandwich an IDT 408. One interdigital electrode of the IDT 408 is connected to an unbalanced signal terminal 411, and the other interdigital electrode of the IDT 408 is connected to the IDT 403 and the IDT 305.

Figure 5:
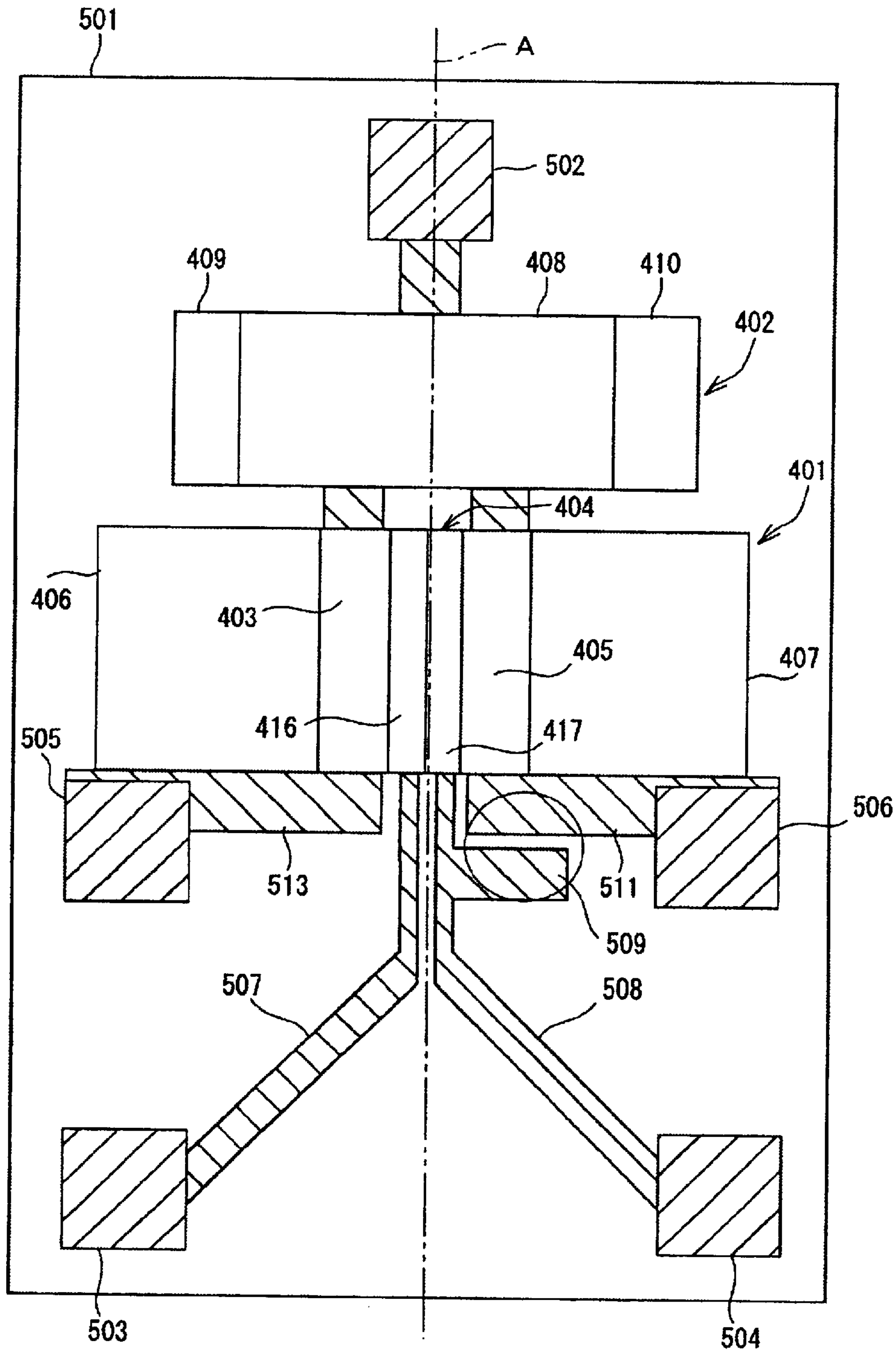
FIG. 5 is a plan showing a layout on a piezoelectric substrate of the surface acoustic wave apparatus according to the first preferred embodiment of the present invention.

FIG. 5 shows an actual layout on the piezoelectric substrate 501 according to the first preferred embodiment of the present invention. In FIG. 5, the same numbers as those used in FIG. 4 are assigned to portions corresponding to those shown in FIG. 4. In the layout, electrode pads 502 to 506 are arranged to be electrically connected to a package. The electrode pad 502 corresponds to the unbalanced signal terminal 411, the electrode pads 503 and 504 correspond to the balanced signal terminals 412 and 413, respectively, and the electrode pads 505 and 506 are grounded terminals. Each IDT is shown in a simplified manner.

Figure 6:
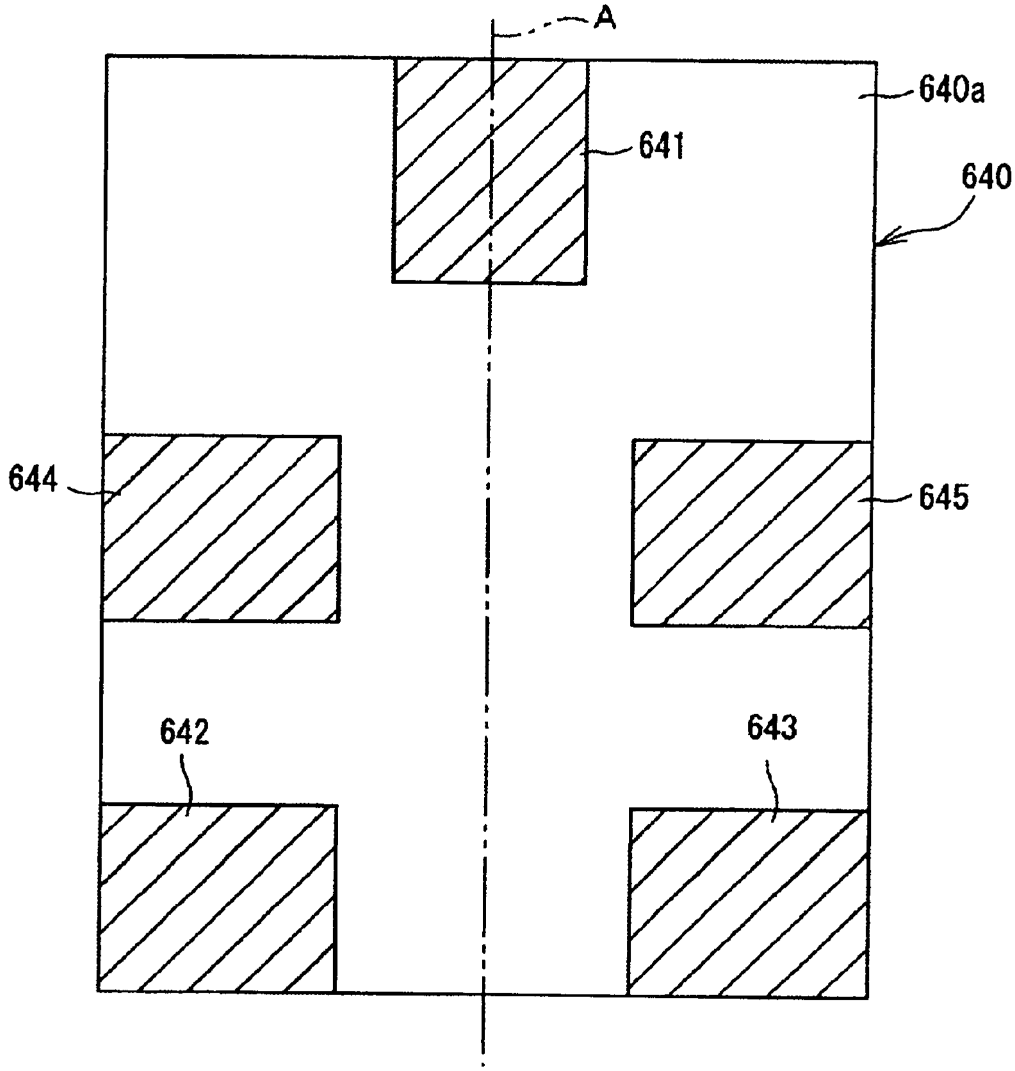
FIG. 6 is a plan showing the arrangement of terminals at the rear surface of a package in which the surface acoustic wave apparatus according to the first preferred embodiment is accommodated, in a see-through view viewed from the upper-surface (the surface opposite the rear surface) side of the package.

FIG. 6 shows (in a see-through view viewed from the upper-surface side of a surface acoustic wave apparatus) electrode terminals 641 to 645 at the rear surface (rectangle-shaped) of a substantially rectangular package 640 in which the structure according to the first preferred embodiment is accommodated. The electrode terminal 641 is disposed at the approximate center of one end section in the longitudinal direction of the rear surface 640*a*. The electrode terminals 642 and 643 are disposed at both corner sections of the other end section in the longitudinal direction of the rear surface 640*a*. The electrode terminals 644 and 645 are disposed at the approximate centers of both side sections in the longitudinal direction of the rear surface 640*a*.

The electrode terminal 641 is the unbalanced signal terminal connected to the electrode pad 502, the electrode terminals 642 and 643 are the balanced signal terminals connected to the electrode pads 503 and 504, respectively, the electrode terminals 644 and 645 are the grounded terminals connected to the electrode terminals 505 and 506, respectively.

Figure 7:
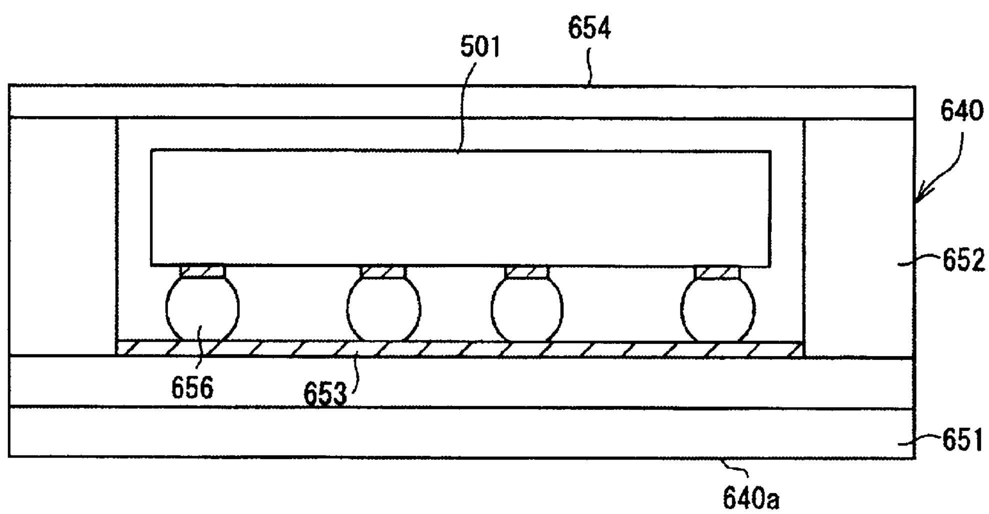
FIG. 7 is a cross-sectional view of the package in which the surface acoustic wave apparatus according to the first preferred embodiment is accommodated.

The surface acoustic wave apparatus according to the first preferred embodiment is produced preferably using a face-down method as shown in FIG. 7, where the electrode surface of the piezoelectric substrate 501 and the die-attach surface 653 of the package 640 are electrically connected via bumps 656.

The package 640 has a substantially rectangular plate-shaped bottom plate 651, side wall sections 652 adjacent to each other and extending upward from the sides of the bottom plate 651, and a cap 654 for covering and contacting the upper ends of the side wall sections 652 to seal the inside of the package 640.

A feature of the first preferred embodiment is that strip-shaped wiring 508 which connects the sub interdigital electrode 417 and the electrode pad 504 has a larger capacitance to the ground, corresponding to a reactance component 120 shown in FIG. 1, than strip-shaped wiring 507 which connects the sub-interdigital electrode 416 and the electrode pad 503.

To make the capacitance to the ground larger, a protrusion 509 is additionally provided for the wiring 508 on the piezoelectric substrate 501 in the outside direction.

It is preferred that the protrusion 509 be provided for the wiring 508 at a location close to wiring 511 which connects the ground-side electrode pad 506 and the IDT 405.

It is also preferable that the protrusion 509 be arranged approximately perpendicular to the wiring 508 in its longitudinal direction and approximately parallel to the wiring 511 in its longitudinal direction, and extend separately from the wiring 511.

With the protrusion 509, the capacitance to the ground of the balanced signal terminal 413, shown in FIG. 4, is greater than that of the balanced signal terminal 412, for example, by about 0.16 pF. Therefore, the wiring 508 and the wiring 507 are arranged asymmetrically to each other.

The electrode fingers of the IDT 404 (the sub-interdigital electrodes 416 and 417), adjacent to the IDTs 403 and 405 are signal electrodes. The electrode finger of the IDT 405, adjacent to the sub-interdigital electrode 417 and connected to the electrode pad 504 with the wiring which makes the capacitance to the ground larger, is also a signal electrode. The electrode finger of the IDT 403, adjacent to the sub-interdigital electrode 416 and connected to the electrode pad 503 is a ground electrode.

Further, in the first preferred embodiment, except for the protrusion 509, the structure, the layout on the piezoelectric substrate 501, and the package 640 are all symmetrical about a virtual axis A that is substantially perpendicular to the propagation direction of surface acoustic waves and at the approximate center of the IDT 404 divided into the two electrodes, as shown in FIG. 4 to FIG. 6. With this, any unbalanced component is prevented, except for the different polarities of the electrode fingers of the IDT 403 and the IDT 405 adjacent to the IDT 404.

Detailed design parameters for the longitudinally-coupled-resonator-type surface acoustic wave filter 401 are shown below, where λI indicates the wavelength determined by the pitch of the electrode fingers for which the pitch has not been reduced.

Overlap width: about 78.9λI

Number of electrode fingers in IDTs (in the order of IDT 403, IDT 404, and IDT 405): 19 (3), (3) 26 (3), (3) 19 (the numbers of electrode fingers for which the pitch has been made smaller are indicated in parentheses)

Number of electrode fingers in reflectors: 200

Duty: about 0.67 (for both IDTs and reflectors)

Electrode film thickness: about 0.095λI

Detailed design parameters for the surface acoustic wave resonator 402 are shown below.

Overlap width: about 46.5λI

Number of electrode fingers in IDTs: 150

Number of electrode fingers in reflectors: 100

Duty: about 0.67

Electrode film thickness: about 0.097λI

Figure 8:
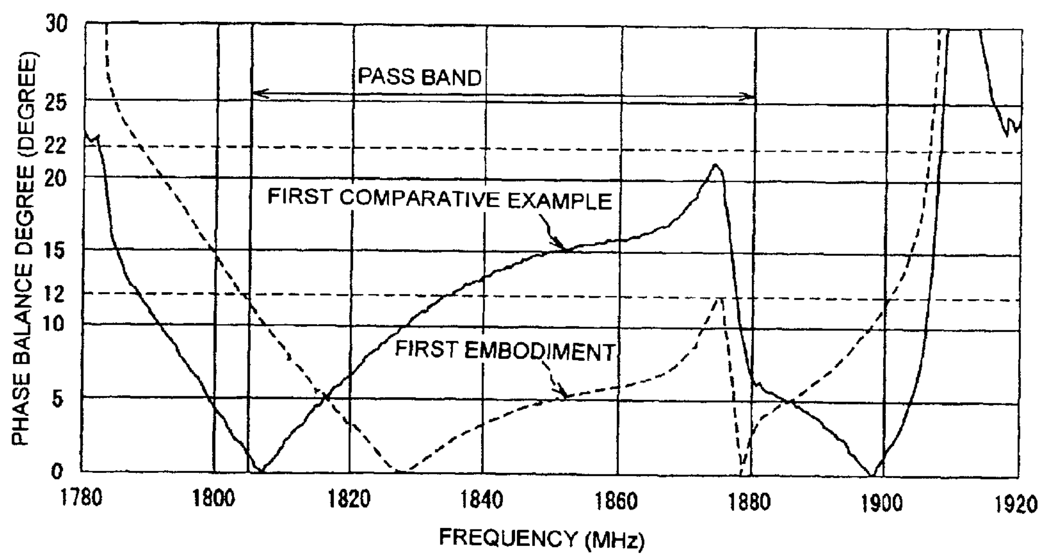
FIG. 8 is a graph indicating the phase balance degrees of the first preferred embodiment and a first comparative example.
Figure 9:
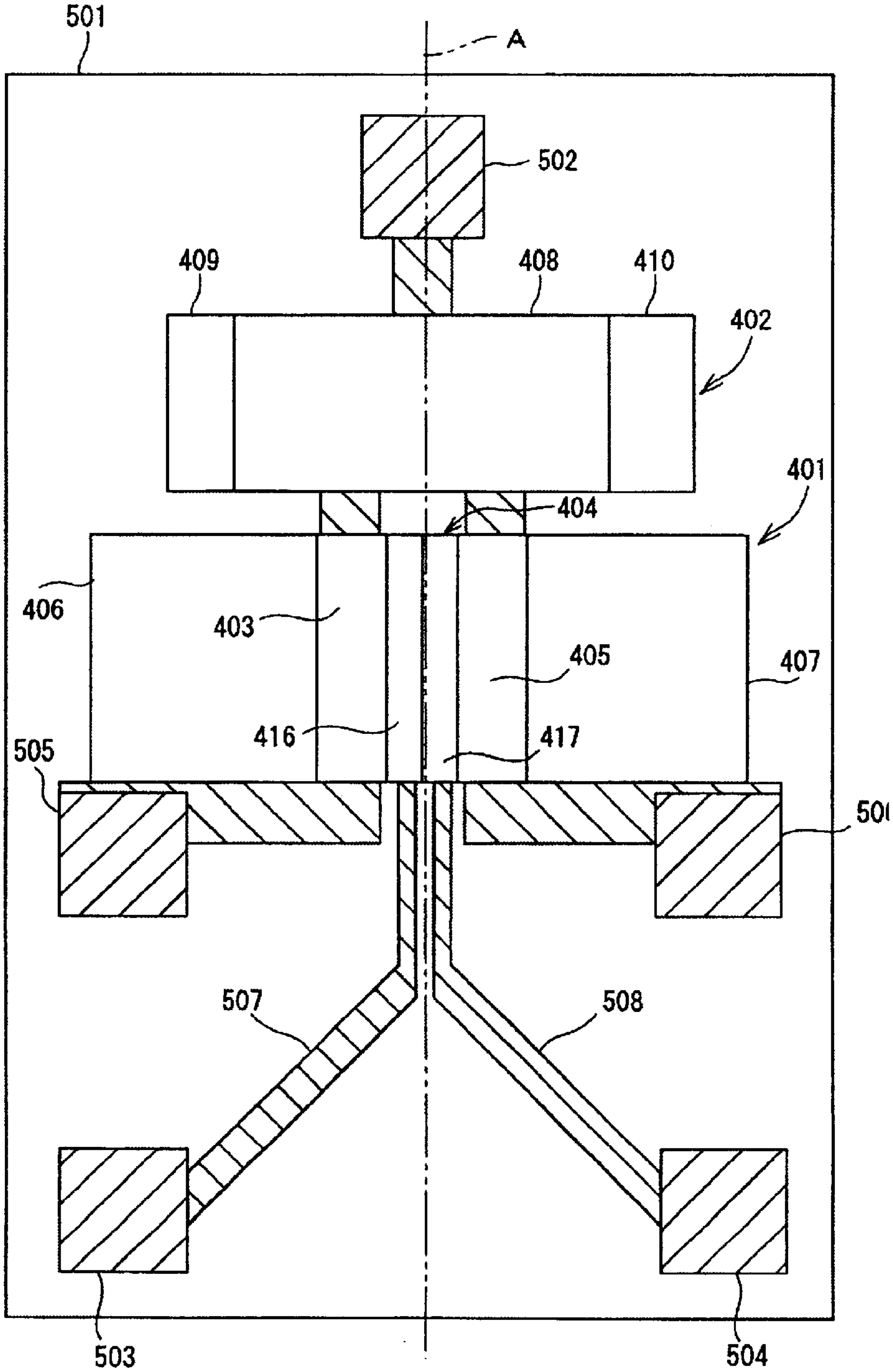
FIG. 9 is a plan showing a layout in a surface acoustic wave apparatus according to the first comparative example.

The operation and advantages of the structure of the first preferred embodiment will now be described. FIG. 8 shows the phase balance degree of the structure of the first preferred embodiment. A first comparative example for comparison is the same as the first preferred embodiment shown in FIG. 5 in structure, in design of the surface acoustic wave apparatus, in layout on the piezoelectric substrate 501, and in package mounting method, except that, in the first comparative example, as shown in FIG. 9, the protrusion 509, which makes the capacitance to the ground larger, is not provided for the wiring 508 in the layout on the piezoelectric substrate 501 and the wiring 508 and the wiring 507 are symmetrical about the virtual axis A. FIG. 8 also shows the phase comparative degree of the first comparative example, which has no protrusion on the piezoelectric substrate 501.

The pass band of DCS receiving filters ranges from 1805 MHz to 1880 MHz. From FIG. 8, it is found that, whereas the first comparative example has a maximum shift of about 22 degrees in the phase balance degree in the pass band, the first preferred embodiment has a maximum shift of about 12 degrees, which is improved by about 10 degrees. This is because the capacitance of the balanced signal terminal 413 to the ground is larger, which compensates for a shift in phase between the balanced signal terminal 412 and the balanced signal terminal 413.

Figure 10:
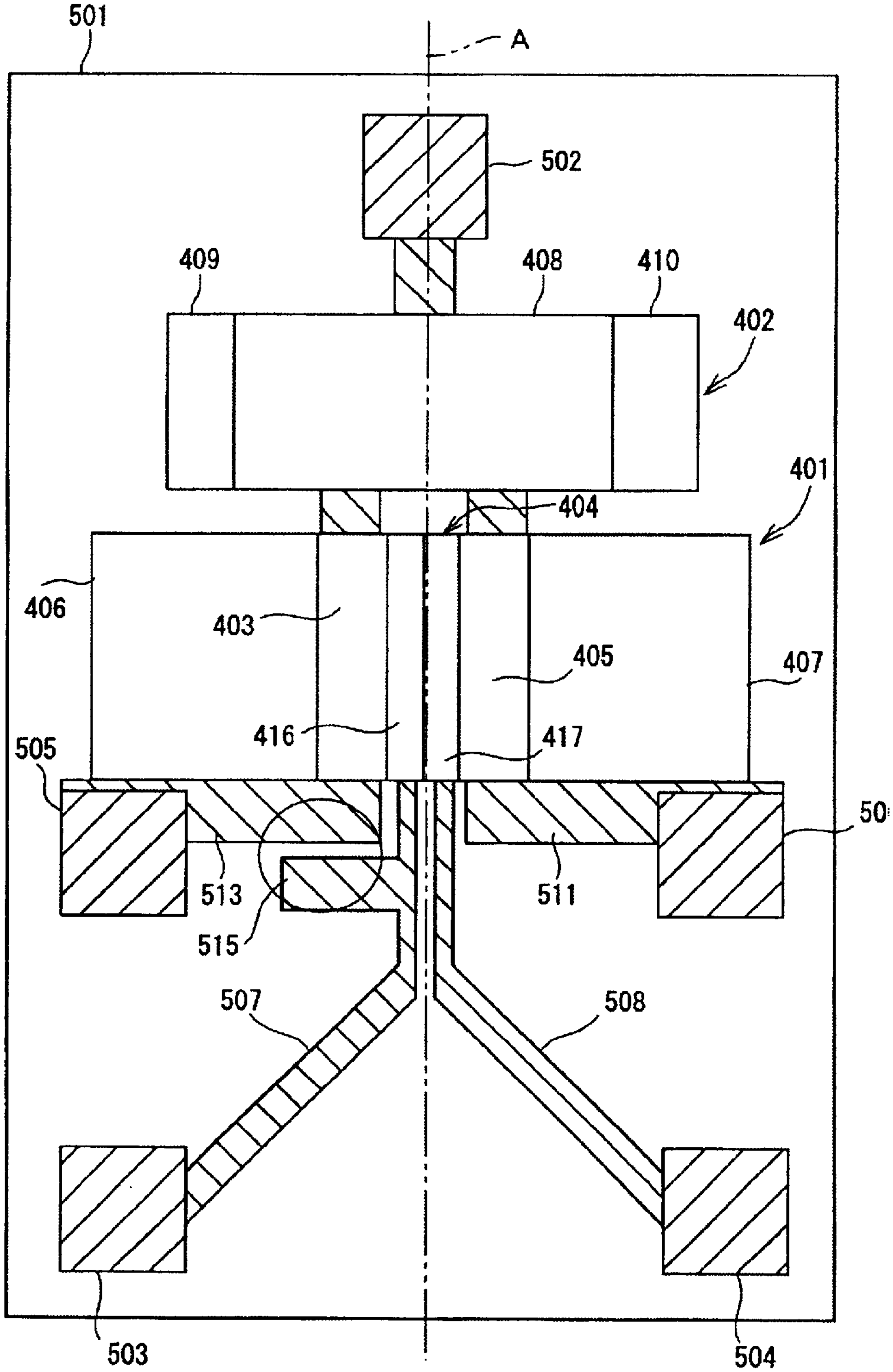
FIG. 10 is a plan showing a layout in a surface acoustic wave apparatus serving as a second comparative example.
Figure 11:
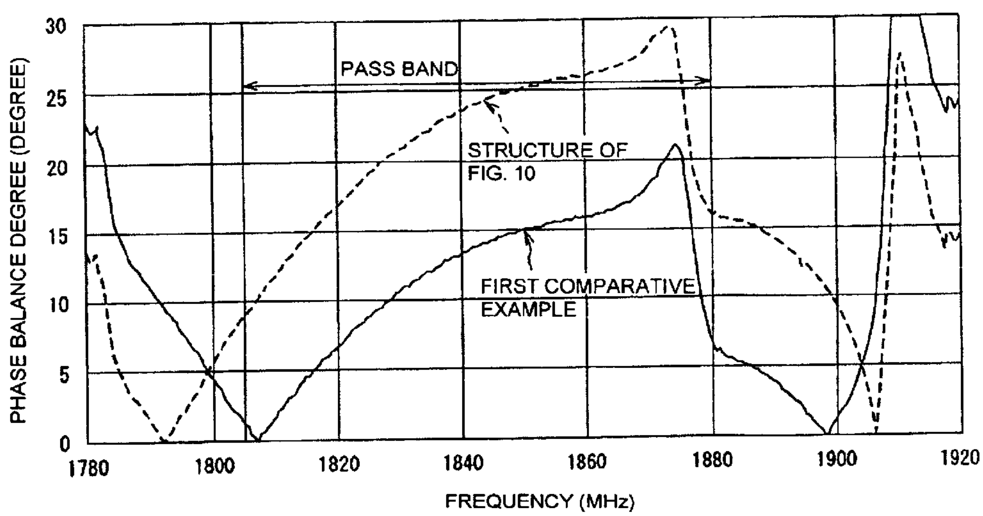
FIG. 11 is a graph indicating the phase balance degrees of the second comparative example shown in FIG. 10 and the first comparative example.

In the first preferred embodiment, the protrusion 509, which makes the capacitance to the ground larger, is provided for the wiring 508. Conversely, a protrusion 515, which makes the capacitance to the ground larger, is provided for the wiring 507, as shown in FIG. 10, and thereby, the capacitance of the balanced signal terminal 412 to the ground is larger by about 0.16 pF. A phase balance degree in this case is examined. FIG. 11 shows the phase balance degree obtained in the case shown in FIG. 10. FIG. 11 also shows the result of the first comparative example shown in FIG. 9, for comparison.

When the capacitance of the balanced signal terminal 412 to the ground is larger, the phase balance degree is worse than that of the first comparative example. The capacitance of which balanced signal terminal to the ground is larger must be determined by the arrangement of the electrode fingers of the IDTs 403 to 405, adjacent to each other, that is, whether there is a no-electric-field area, where signal electrodes are disposed adjacent to each other or where ground electrodes are disposed adjacent to each other.

In the first preferred embodiment, the electrode fingers of the IDT 404, adjacent to the IDTs 403 and 405 are the sub-interdigital electrodes 416 and 417, which are signal electrodes. The electrode finger of the IDT 405 adjacent to the IDT 404, which is adjacent to the sub-interdigital electrode 417, and which is connected to the wiring which makes the capacitance to the ground larger and connected to the electrode pad 504, is a signal electrode, and forms a no-electric-field or weak-electric-field area together with the outermost electrode finger of the opposing sub interdigital electrode 417, which is a signal electrode. The electrode finger of the IDT 403 adjacent to the IDT 404, which is adjacent to the sub-interdigital electrode 416, and that is connected to the electrode pad 503, is a ground electrode, and defines an electric-field area which is larger in electric-field strength than the no-electric field or weak-electric field-area, together with the most outside electrode finger of the opposing sub-interdigital electrode 416, which is a signal electrode.

When electrode fingers are arranged in this manner, if the protrusion 509, for example, is arranged such that the capacitance of the balanced signal terminal 413 to the ground, connected to the sub interdigital electrode 417 having a no-electric-field area in a vicinity of its most outside electrode finger (or in contact with the most outside electrode finger) is larger than that of the balanced signal terminal 412 connected to the sub-interdigital electrode 416, as shown in the first preferred embodiment, the phase balance degree is greatly improved.

Figure 12:
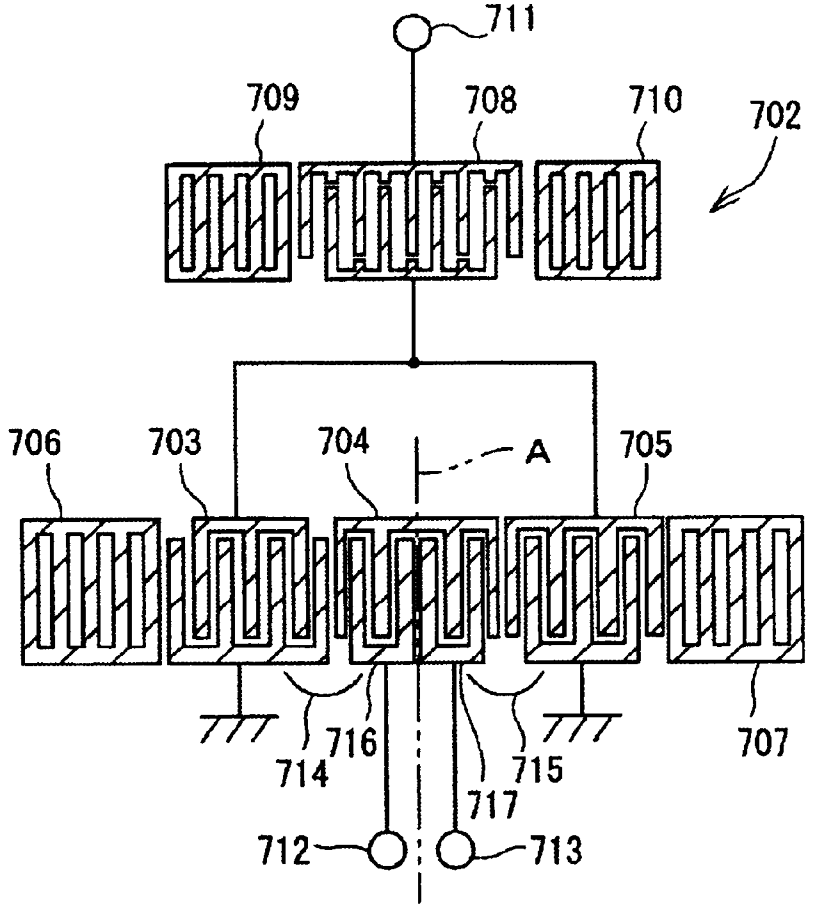
FIG. 12 is a structural view showing the electrode structure of a surface acoustic wave apparatus according to a modification of the first preferred embodiment of the present invention.
Figure 13:
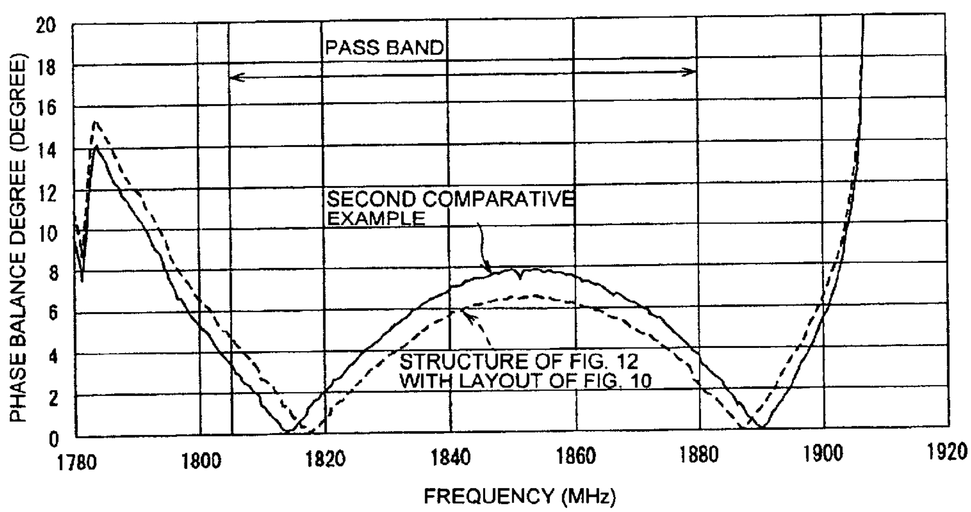
FIG. 13 is a graph showing the relationships between the frequency and phase balance degree, of the second comparative example and of a case in which the electrode structure shown in FIG. 12 is used at the layout on the piezoelectric substrate shown in FIG. 10.
Figure 14:
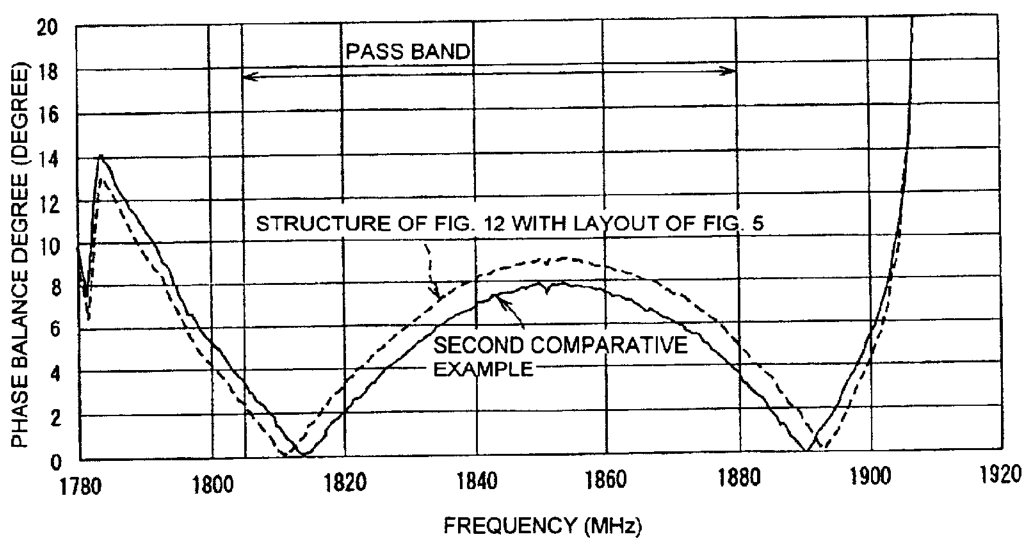
FIG. 14 is a graph showing the relationships between the frequency and phase balance degree, of the second comparative example and of a case in which the electrode structure shown in FIG. 12 is used at the layout on the piezoelectric substrate shown in FIG. 5.

A case in which the electrode fingers of an IDT 704, adjacent to the IDTs 703 and 705 are neutral-point electrodes (either floating electrodes or ground electrodes can be used) as shown in FIG. 12 will now be described. FIG. 13 shows the phase balance degree obtained with the electrode structure shown in FIG. 12 on the piezoelectric substrate 501 shown in FIG. 10 (a modification of the first preferred embodiment). FIG. 14 shows the phase balance degree obtained with the electrode structure shown in FIG. 12 on the piezoelectric substrate 501 shown in FIG. 5 (third comparative example). FIG. 13 and FIG. 14 also show the phase balance degree obtained with the electrode structure shown in FIG. 12 on the piezoelectric substrate 501 (without a protrusion) shown in FIG. 9 as a second comparative example. FIG. 13 and FIG. 14 show the results obtained when the protrusions 515 and 509 are adjusted so as to correspond to a capacitance to the ground of about 0.02 pF.

The phase balance degree is improved when the capacitance to the ground, of the balanced signal terminal 412, connected to the sub-interdigital electrode 716, is larger than of the balanced signal terminal 713, connected to the sub-interdigital electrode 717, as shown in the layout of FIG. 10 if electrode fingers are arranged as shown in FIG. 12.

Cases in which a delay line and an inductance component are added in series to a balanced signal terminal in an unbalanced manner at the electrode structure shown in FIG. 12 will now be described.

Figure 15:
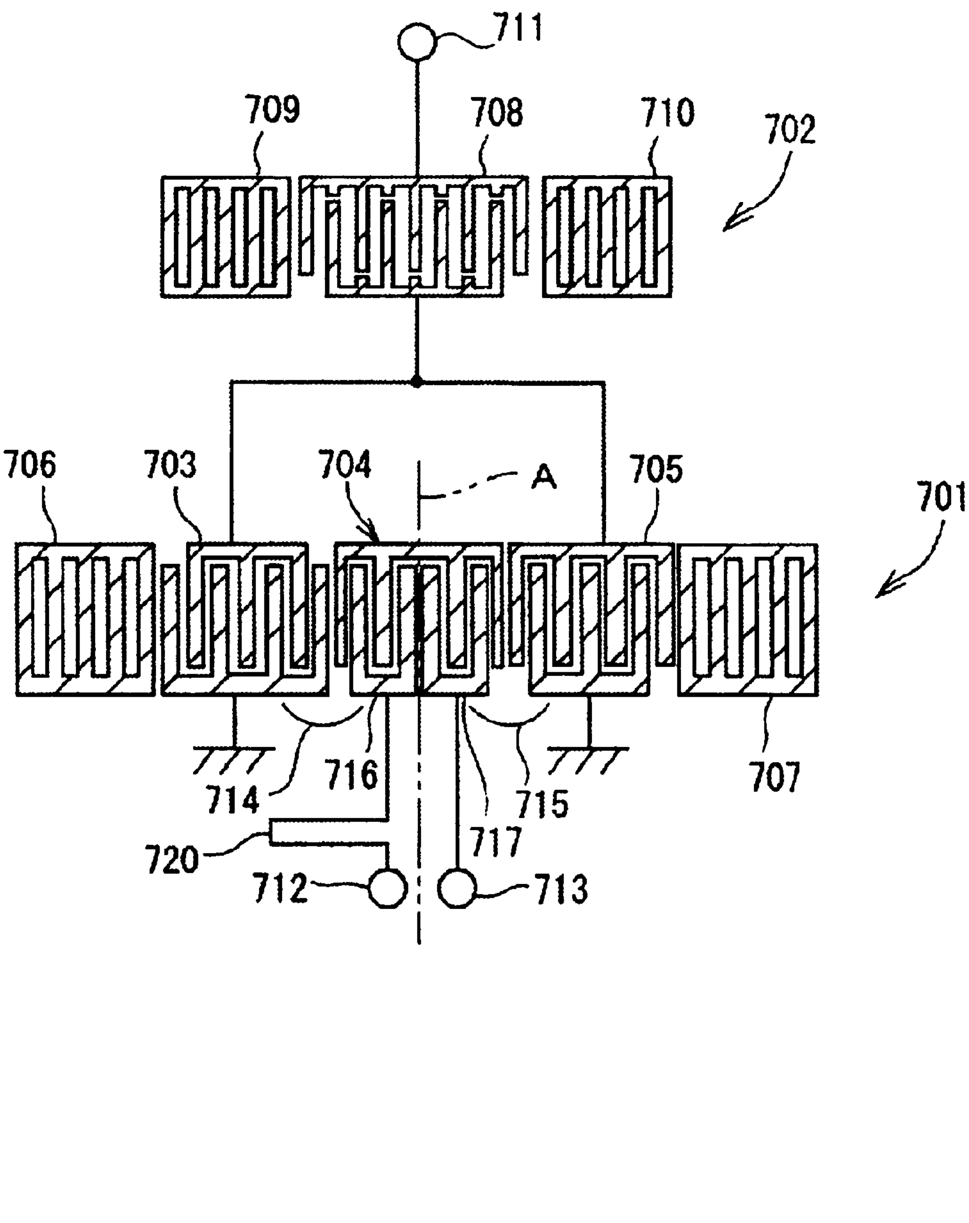
FIG. 15 is a structural view showing a surface acoustic wave apparatus according to another modification of the first preferred embodiment of the present invention.
Figure 16:
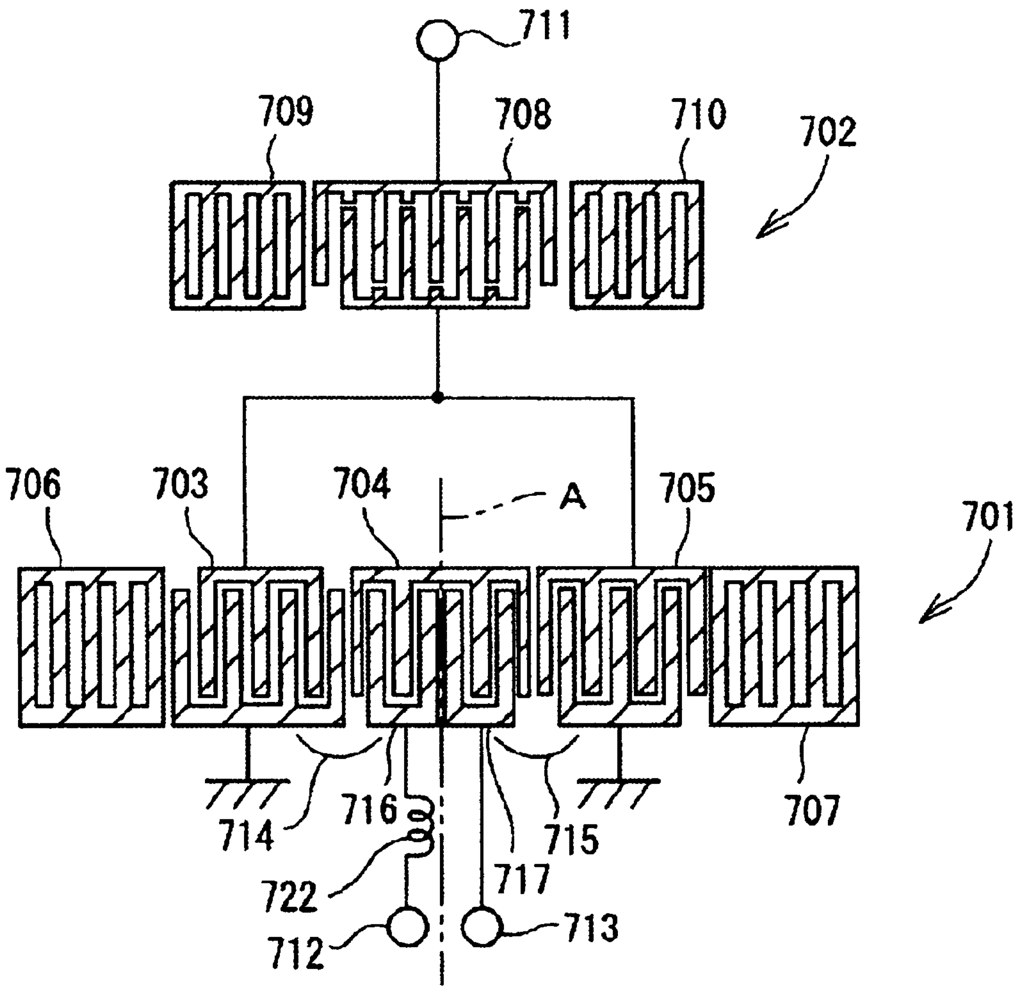
FIG. 16 is a structural view showing a surface acoustic wave apparatus according to still another modification of the first preferred embodiment of the present invention.

FIG. 15 shown another modification of the first preferred embodiment in which a delay line 720 defining the reactance component 120 shown in FIG. 1 is added to the balanced signal terminal 712, connected to the sub-interdigital electrode 716. FIG. 16 shows still another modification of the first preferred embodiment in which an inductance component 722 defining the reactance component 120 shown in FIG. 1 is added.

Figure 17:
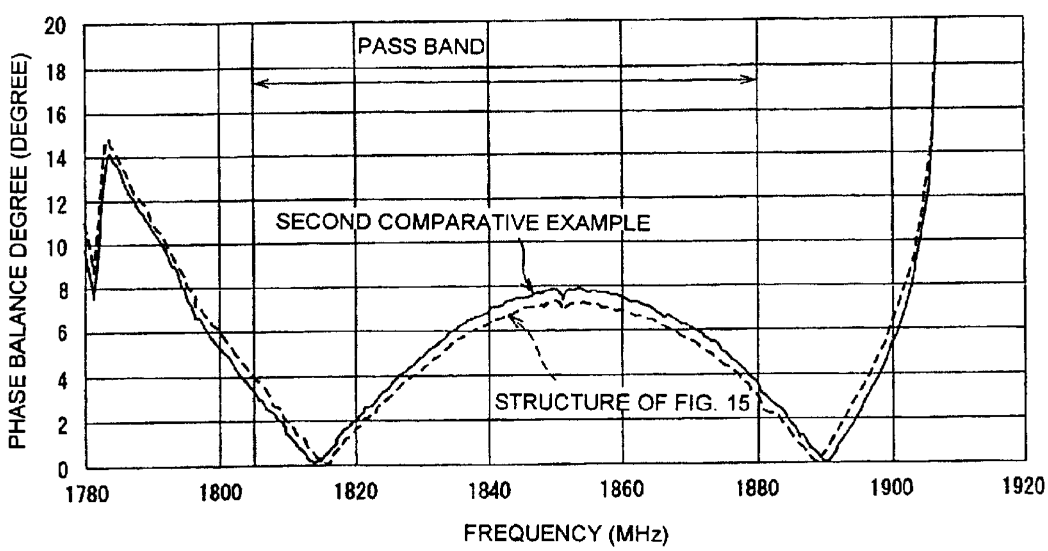
FIG. 17 is a graph showing the relationships between the frequency and phase balance degree, of the structure shown in FIG. 15 and of the second comparative example.
Figure 18:
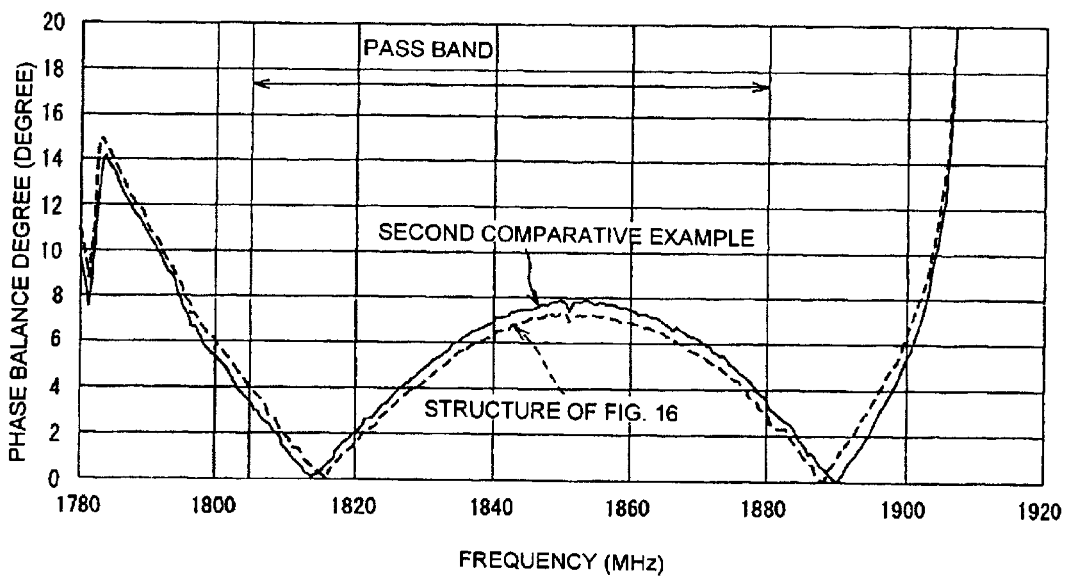
FIG. 18 is a graph showing the relationships between the frequency and phase balance degree, of the structure shown in FIG. 16 and of the second comparative example.

FIG. 17 and FIG. 18 show the phase balance degree obtained with the structures shown in FIG. 15 and FIG. 16, respectively. FIG. 17 and FIG. 18 also show the phase balance degree obtained with the electrode structure shown in FIG. 12 with the layout of FIG. 9, where neither a delay line nor an inductance component is added, as the second comparative example.

Specific methods for forming the delay line 720 and the inductance component 722 are omitted, the delay line may be formed of long wiring on the piezoelectric substrate or in the package, and the inductance component may be formed of a microstrip line.

Figure 31A:
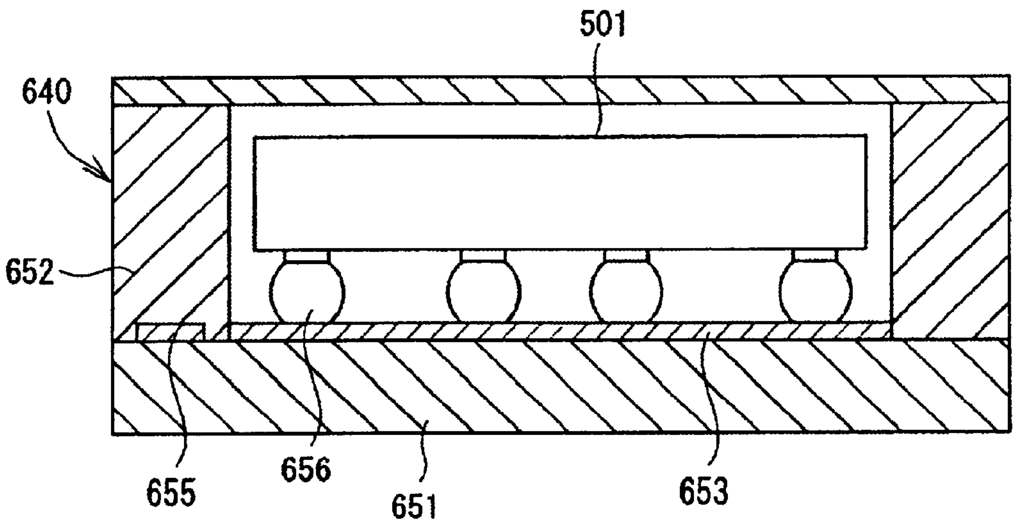
FIG. 31A and FIG. 31B show cross-sectional views of packages in which the surface acoustic wave apparatus according to the first preferred embodiment is accommodated, and to which a reactance component or a delay line is externally connected.
Figure 31B:
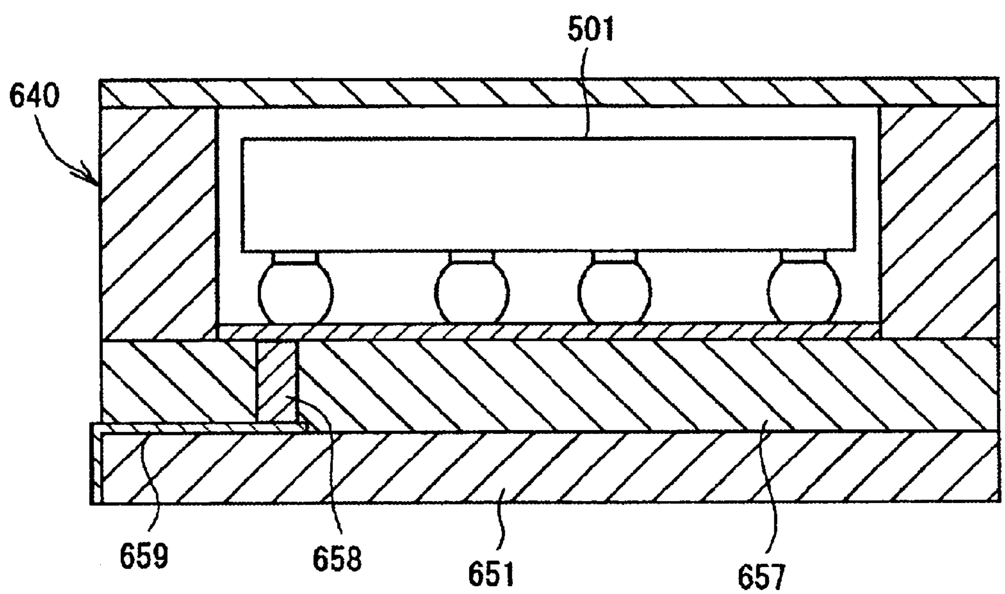

If possible, the delay line and the inductance component may be provided outside of the package and externally connected, as shown in FIG. 31A and FIG. 31B. In FIG. 31A, a circuit 655 defining the delay line and the inductance component (reactance component) is provided at the boundary of the bottom plate 651 and a side wall section 652. In FIG. 31B, a lamination plate 657 is provided on the bottom plate 651, a via hole 658 is provided for the lamination plate 657 in its thickness direction, and a circuit 659 defining the delay line and the inductance component is connected through the via hole 658 and is provided between the bottom plate 651 and the lamination plate 657.

It is understood from FIG. 17 and FIG. 18 that the phase balance degree obtained when either of the delay line 720 and the inductance component 722 is inserted is better than that obtained in the second comparative example. In the electrode structure shown in FIG. 4, the delay line 720 or the inductance component 722 must be added to the balanced signal terminal 413.

As described above, in the surface acoustic wave apparatus according to the first preferred embodiment having the longitudinally-coupled-resonator-type surface acoustic wave filter in which the three IDTs are provided on the piezoelectric substrate in the direction in which surface acoustic waves propagate, where the IDT disposed at the center among the three IDTs is divided into two parts in the propagation direction of the surface acoustic waves and the polarities of the left and right IDTs are inverted to each other to provide a balanced-to-unbalanced conversion function, when the reactance component defined by at least one of the capacitance to the ground, the inductance component connected in series, and the delay line connected in series is made asymmetrical between the two balanced signal terminals, the phase balance degree of the surface acoustic wave apparatus is greatly improved.

Figure 19:
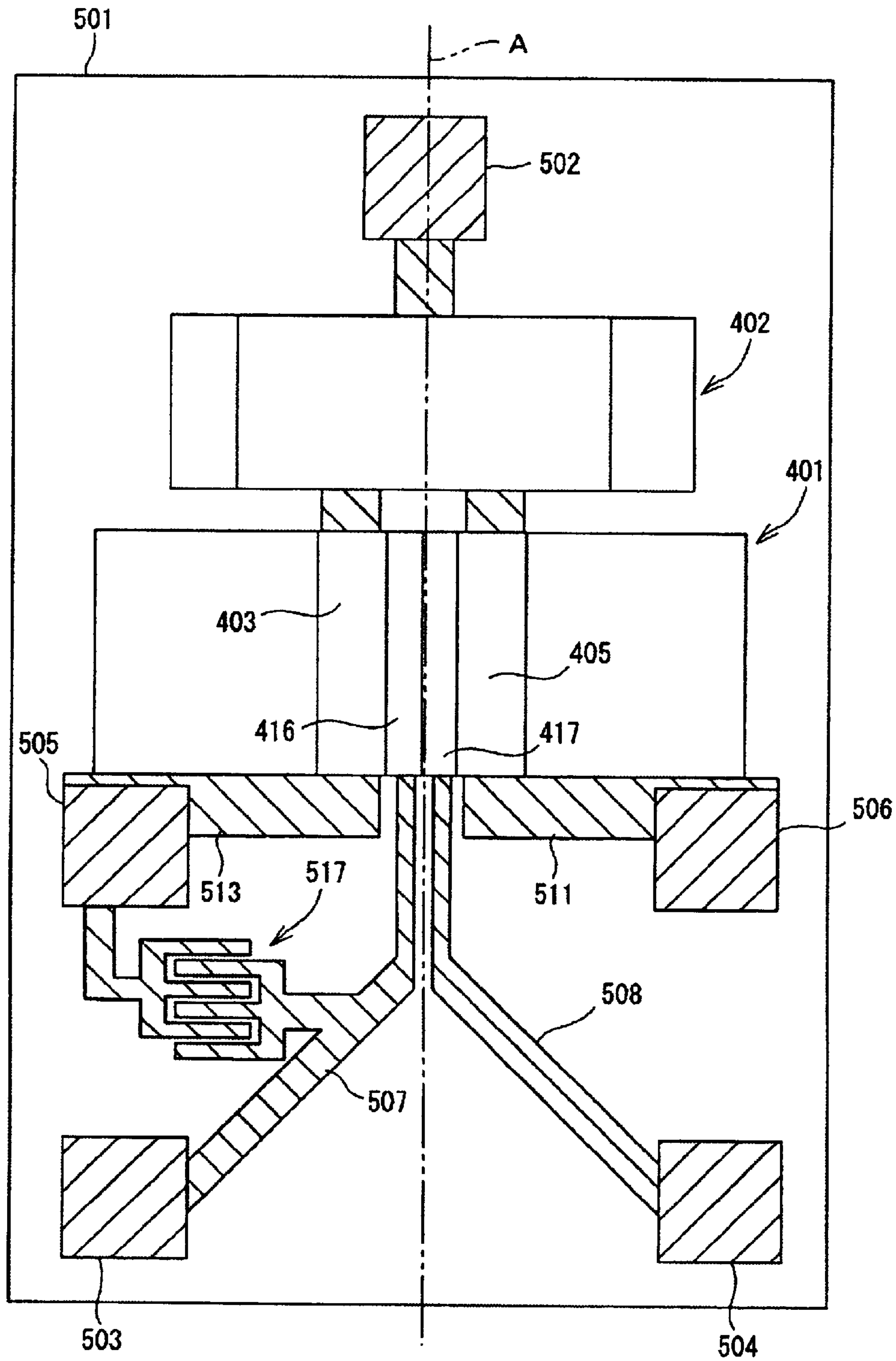
FIG. 19 is a structural view showing a surface acoustic wave apparatus according to still another modification of the first preferred embodiment of the present invention.

In the first preferred embodiment, as shown in FIG. 5, a signal electrode is disposed close to a ground electrode on the piezoelectric substrate 501 to make the capacitance to the ground larger. Instead, a capacitor 517 may be formed by interdigital electrodes as shown in FIG. 19. Alternatively, wiring may be adjusted in the package 640.

In the first preferred embodiment, the layout on the piezoelectric substrate 501 and the package 640 are preferably made in the same manner for the balanced signal terminals in order to avoid an extraneous unbalanced component, except that the capacitor to the ground, the inductance component, or the delay line is asymmetrically provided. To this end, there are five electrode terminals 641 to 645 at the rear surface 640*a* of the package 640 (see FIG. 6). The present invention is not limited to such a package. Any package may be used as long as the package is symmetrical about a virtual axis A that is substantially perpendicular to the propagation direction of surface acoustic waves and dividing a center IDT into two parts.

Figure 20:
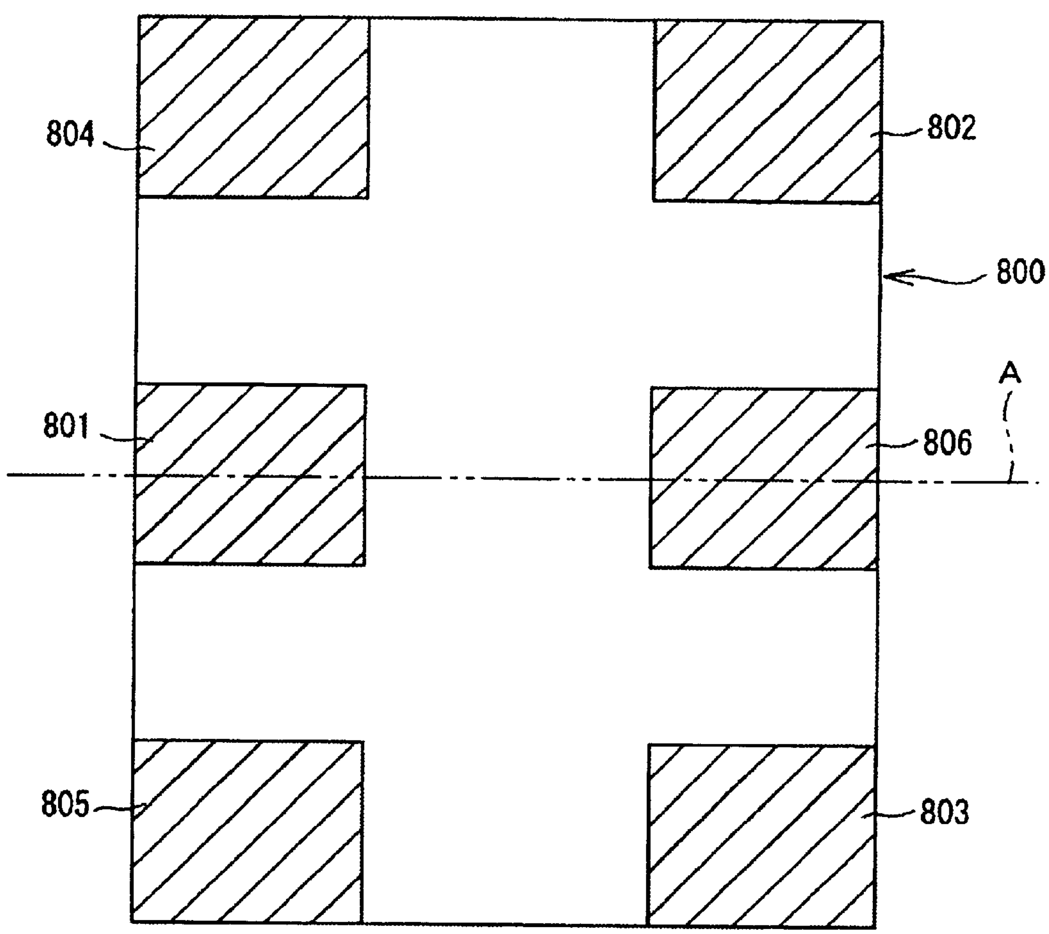
FIG. 20 is a plan showing another arrangement of electrode terminals in the package of the first preferred embodiment of the present invention.
Figure 21:
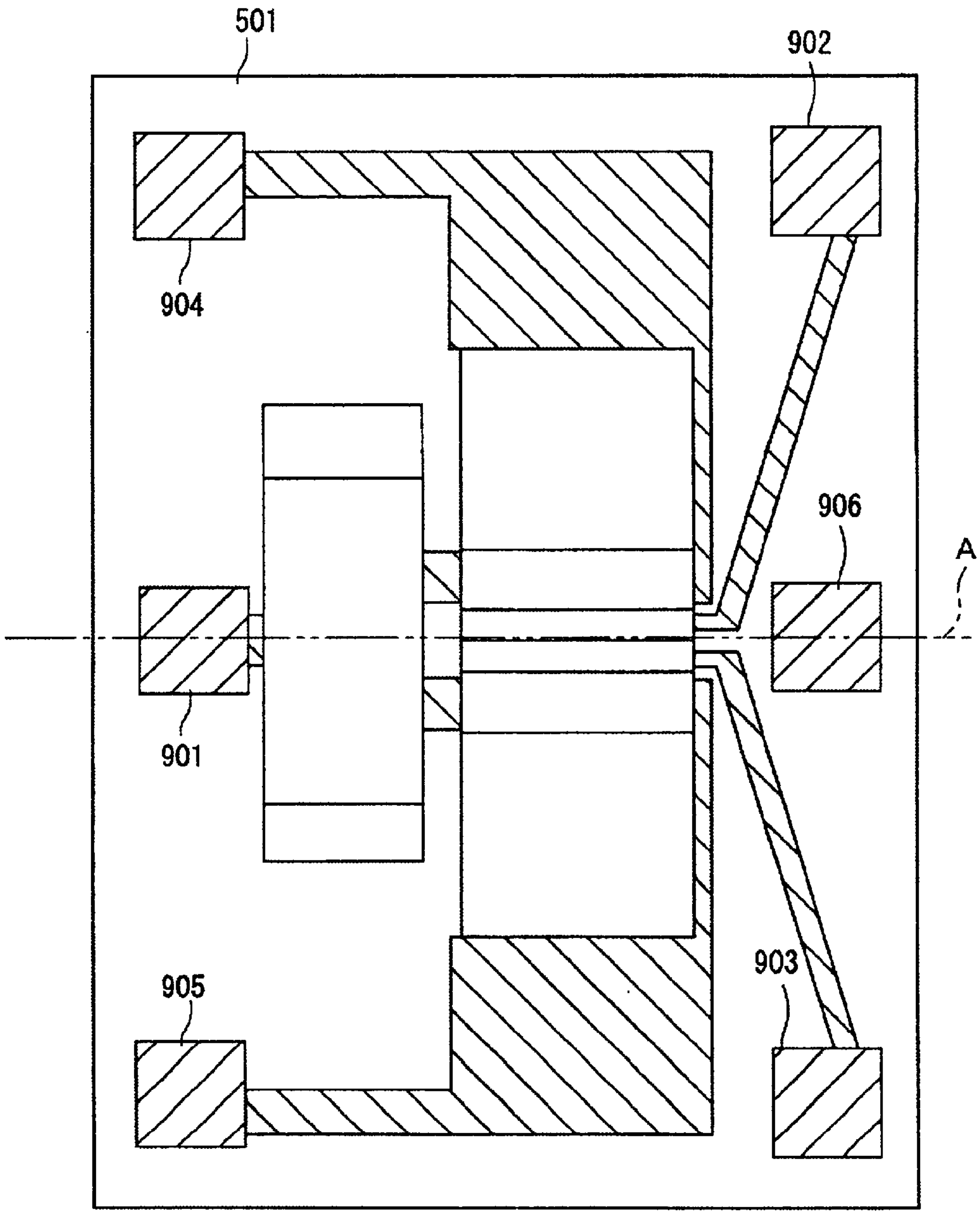
FIG. 21 is a structural view showing still another modification of the surface acoustic wave apparatus according to the first preferred embodiment of the present invention.

For example, a package 800 having six electrode terminals 801 to 806, as shown in FIG. 20, is symmetrical about a virtual axis A when the electrode terminal 801 is used as an unbalanced signal terminal, the electrode terminals 802 and 803 are used as balanced signal terminals, and the electrode terminals 804 to 806 are used as ground terminals.

In this case, a layout on the piezoelectric substrate 501 is arranged such that the propagation direction of surface acoustic waves are substantially parallel to the longitudinal direction of the piezoelectric substrate 501. When an electric pad 901 on the piezoelectric substrate 501 is connected to the electrode terminal 801, an electrode pad 902 is connected to the electrode terminal 802, an electrode pad 903 is connected to the electrode terminal 803, and electrode pads 904 to 906 are connected to the electrode terminals 804 to 806 which define ground terminals. This layout on the piezoelectric substrate 501 is also symmetrical about the virtual axis A.

In the first preferred embodiment, the package and the piezoelectric substrate are electrically connected preferably by the face-down method to make the surface acoustic wave apparatus, as shown in FIG. 7. Alternatively, a wire bonding method may be used.

Figure 22:
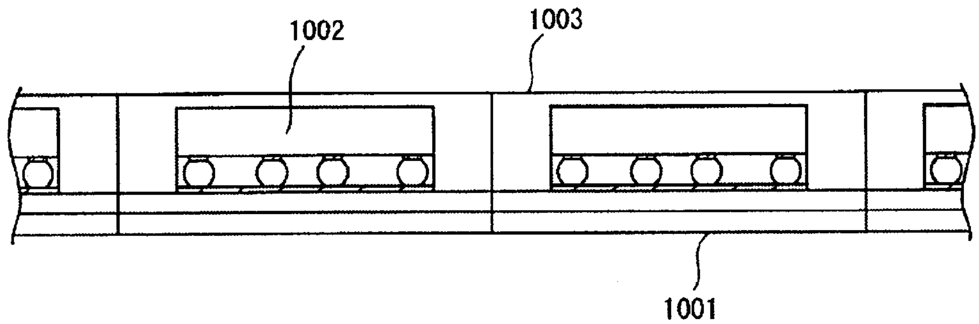
FIG. 22 is a cross-sectional view showing a manufacturing process of the surface acoustic wave apparatus according to the first preferred embodiment of the present invention.
Figure 23:
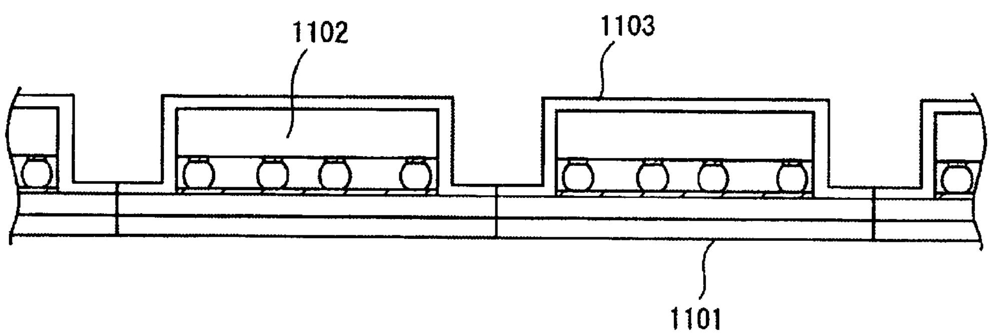
FIG. 23 is a cross-sectional view showing another manufacturing process of the surface acoustic wave apparatus according to the first preferred embodiment of the present invention.

The structure used to make the surface acoustic wave apparatus by the face-down method is not limited to that shown in FIG. 7. For example, as shown in FIG. 22, the structure may be arranged such that piezoelectric substrates 1002 are connected to an assembly board 1001 by a flip-chip method, are then covered and sealed by resin 1003, and are cut into each package by dicing. Alternatively, the structure may be arranged as shown in FIG. 23 such that piezoelectric substrates 1002 are connected to an assembly board 1001 by a flip-chip method, are then covered and sealed by a sheet-shaped resin member 1003, and are cut into each package by dicing.

Figure 24:
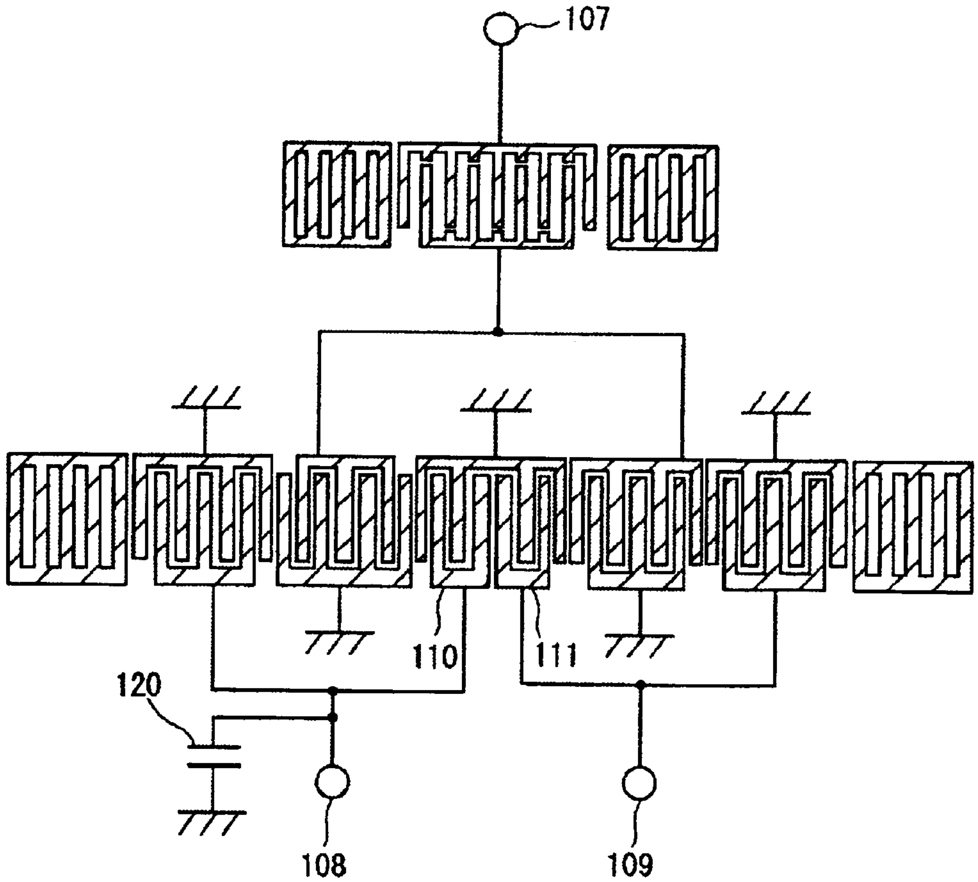
FIG. 24 is a structural view showing still another modification of the surface acoustic wave apparatus according to the first preferred embodiment of the present invention.

In the first preferred embodiment, the surface acoustic wave resonator is connected in series to the longitudinally-coupled-resonator-type surface acoustic wave filter having the three IDTs. It is obvious that the same advantages are obtained when the surface acoustic wave resonator is not connected, or further when the surface acoustic wave resonator is connected in parallel. Alternatively, as shown in FIG. 24, IDTs may be provided at both sides of the three IDTs to define a longitudinally-coupled-resonator-type surface acoustic wave filter having five IDTs.

Figure 25:
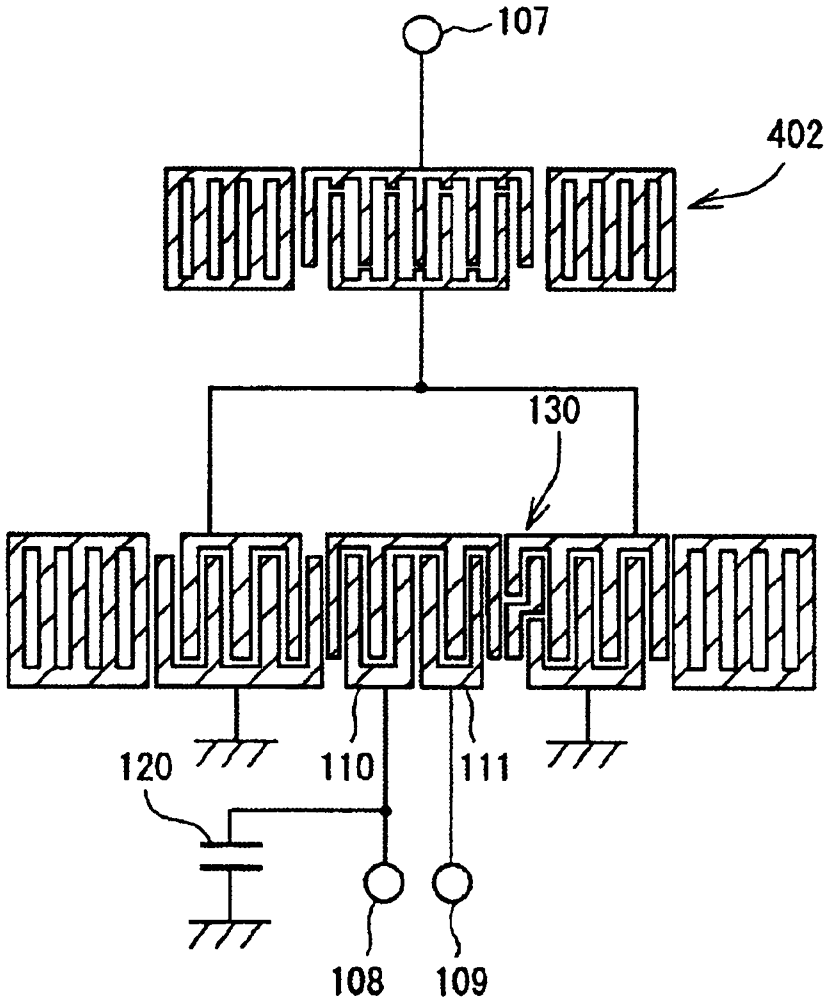
FIG. 25 is a structural view showing still another modification of the surface acoustic wave apparatus according to the first preferred embodiment of the present invention.

Furthermore, even when a weight is applied to an electrode finger 130 close to the boundary of adjacent IDTs, as shown in FIG. 25, the same advantages as in various preferred embodiments of the present invention are obtained. The balance degrees are further improved in the structure shown in FIG. 25. A thinning-out weight, an overlap-width weight, or a duty weight may be applied.

Figure 2:
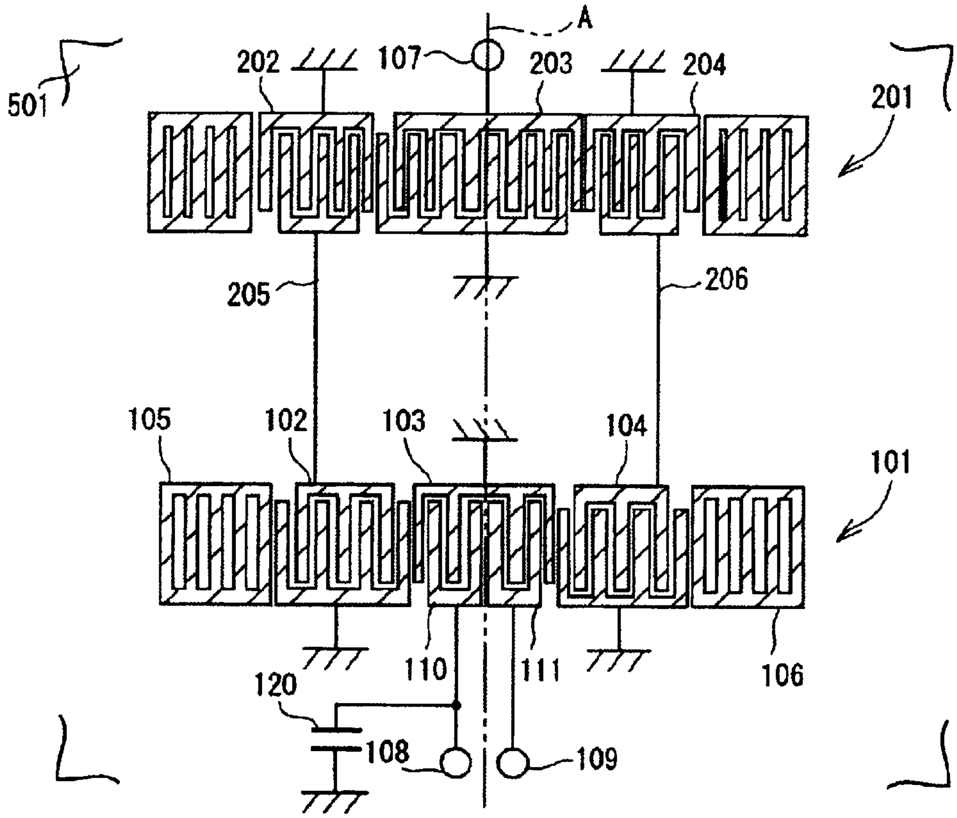
FIG. 2 is a structural view of a modification (cascade connection) of the surface acoustic wave apparatus.
Figure 3:
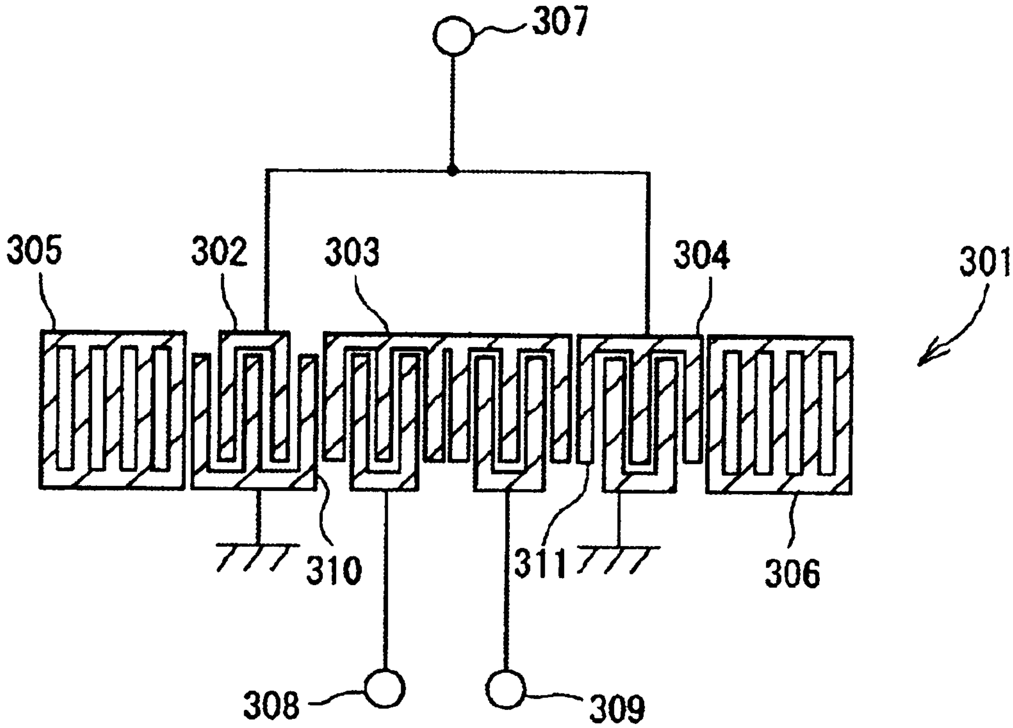
FIG. 3 is a structural view of a conventional surface acoustic wave apparatus.

In the present invention, as shown in FIG. 2, a longitudinally-coupled-resonator-type surface acoustic wave filter 101 may be connected in cascade to another longitudinally-coupled-resonator-type surface acoustic wave filter 201. In this case, it is preferable that an IDT 203 arranged at the approximate center of the longitudinally-coupled-resonator-type surface acoustic wave filter 201 has an even number of electrode fingers.

It is also preferred that the direction of IDTs 102, 104, 202, and 204 be adjusted such that signals transferring through signal lines 205 and 206 which connect the longitudinally-coupled-resonator-type surface acoustic wave filter 101 and the longitudinally-coupled-resonator-type surface acoustic wave filter 201 have an almost-180-degree phase difference. With this arrangement, a surface acoustic wave apparatus having further better balance degrees is obtained.

Figure 26:
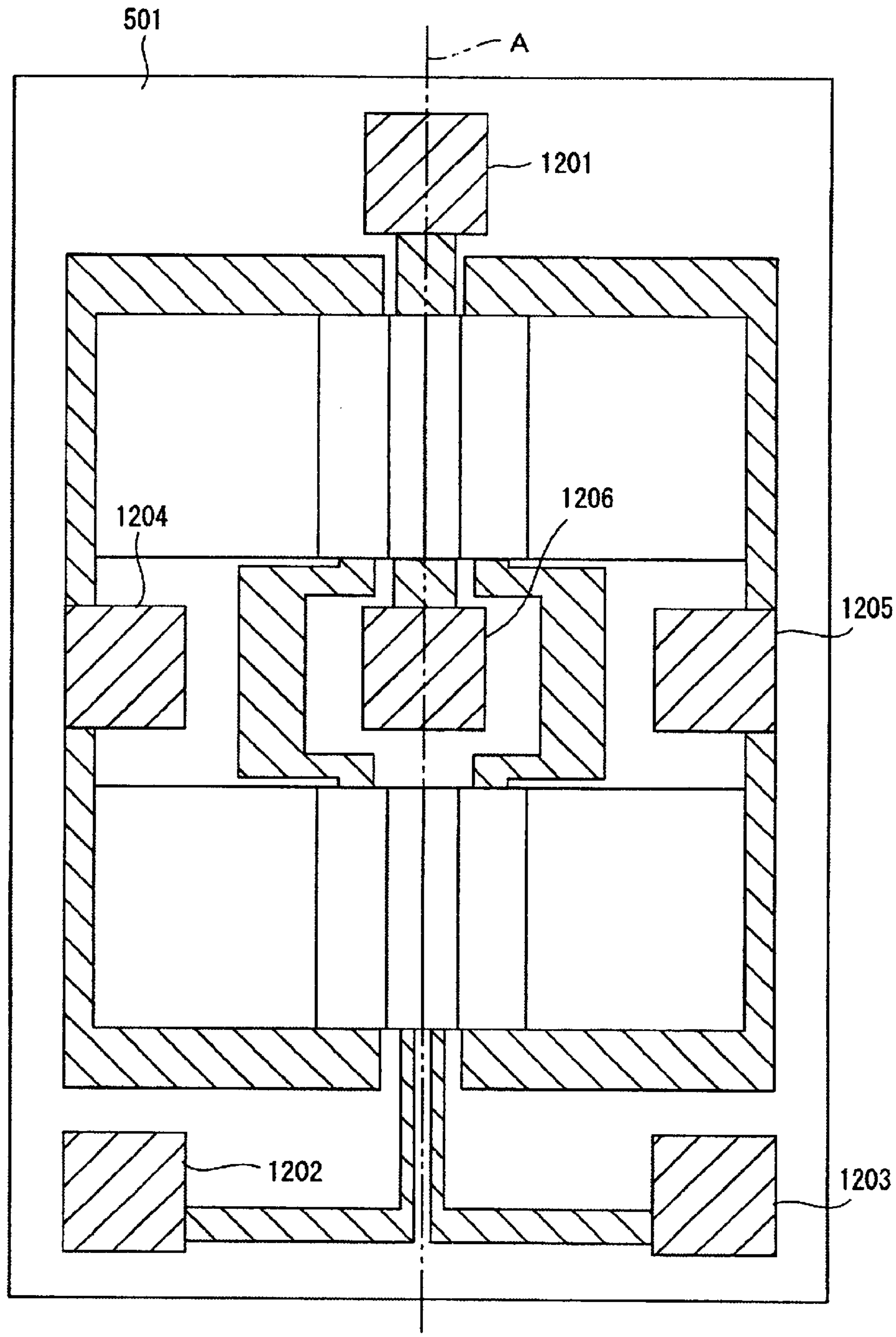
FIG. 26 is a plan showing an example layout on the piezoelectric substrate in a case in which the electrode structure shown in FIG. 2 is mounted to the package having the electrode terminals at the rear surface side, shown in FIG. 6.
Figure 27:
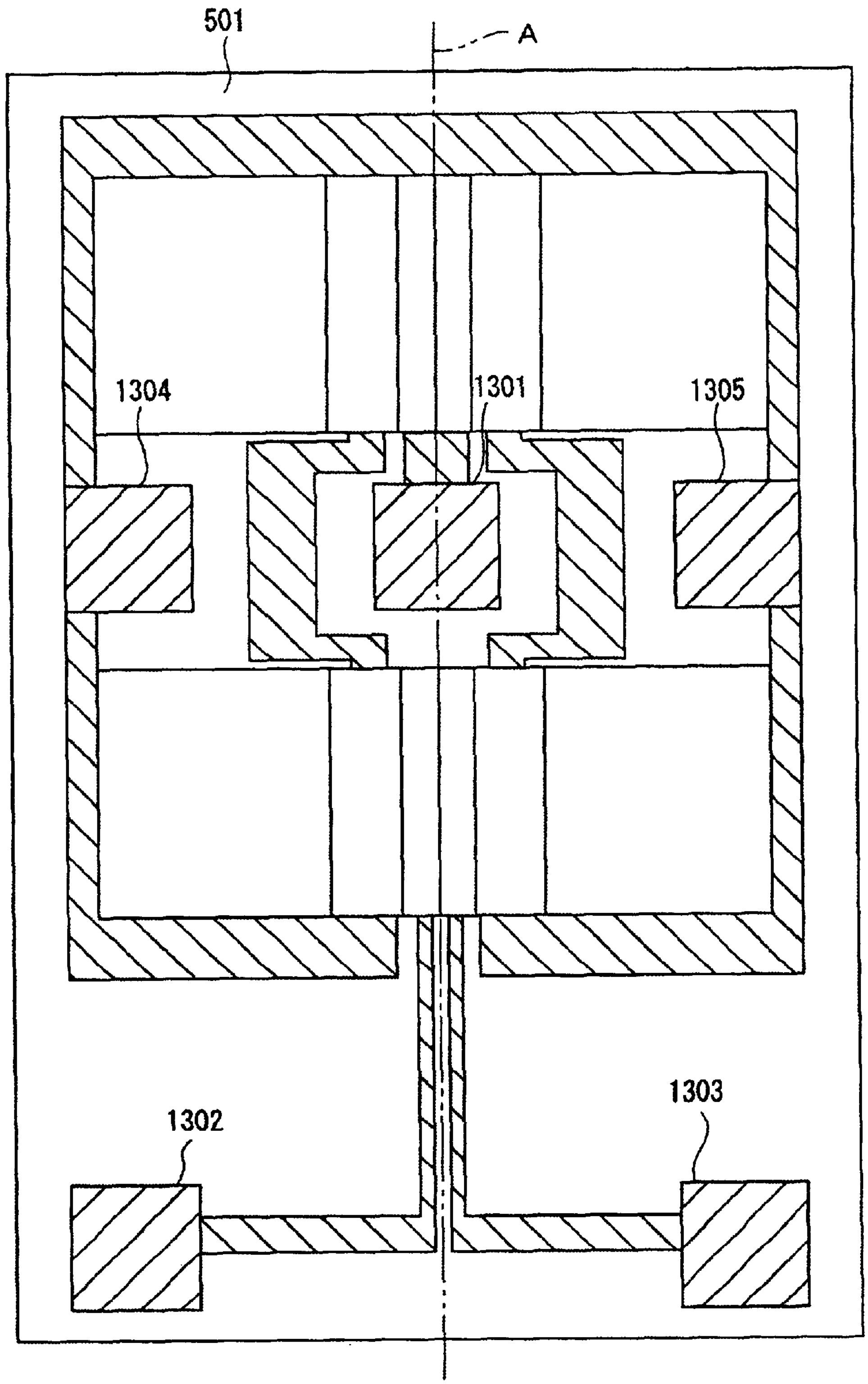
FIG. 27 is a plan showing another example layout on the piezoelectric substrate in a case in which the electrode structure shown in FIG. 2 is mounted to the package having the electrode terminals at the rear surface side, shown in FIG. 6.
Figure 28:
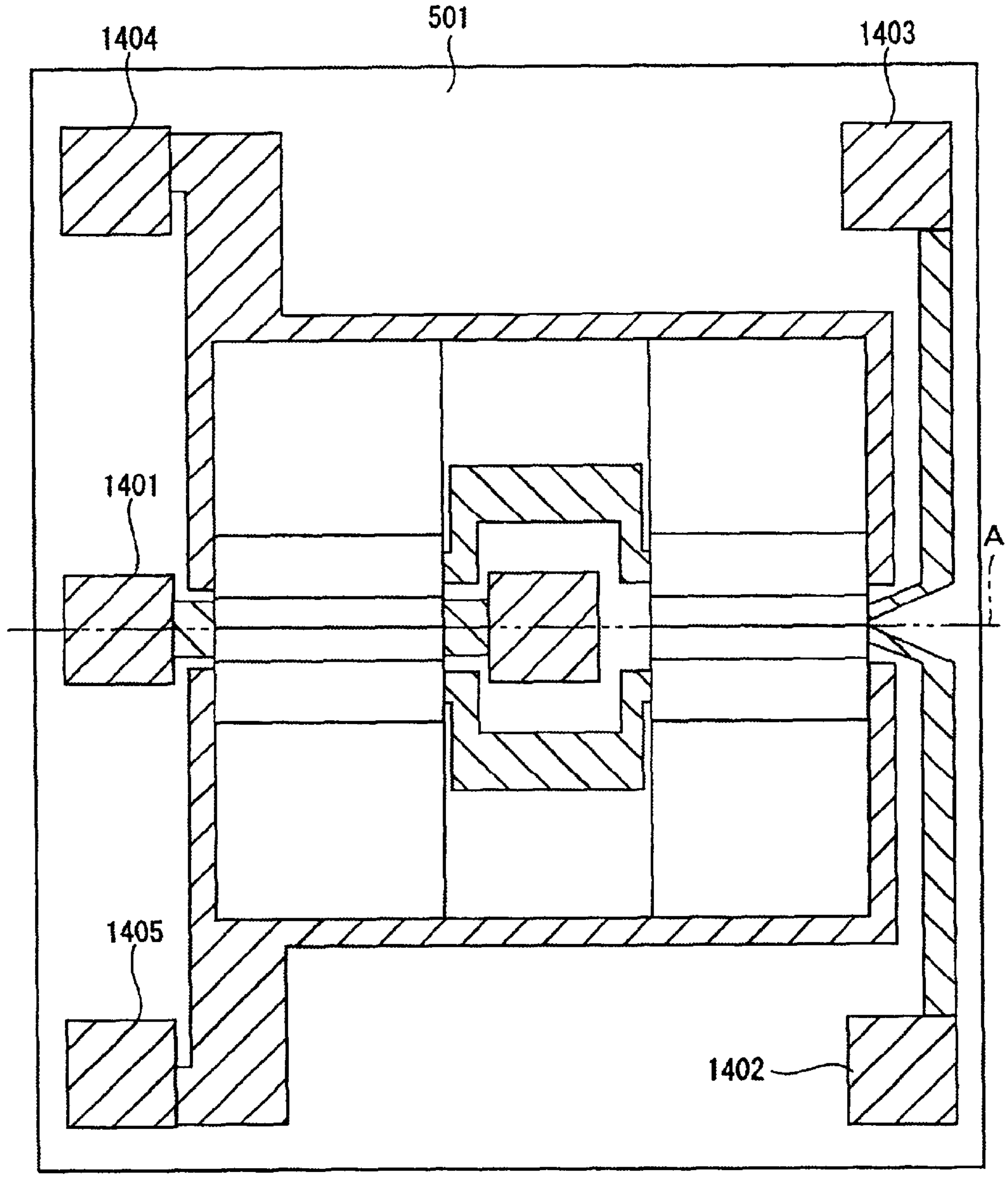
FIG. 28 is a plan showing an example layout on the piezoelectric substrate in a case in which the electrode structure shown in FIG. 2 is mounted to the package having the electrode terminals at the rear surface side, shown in FIG. 20.
Figure 29:
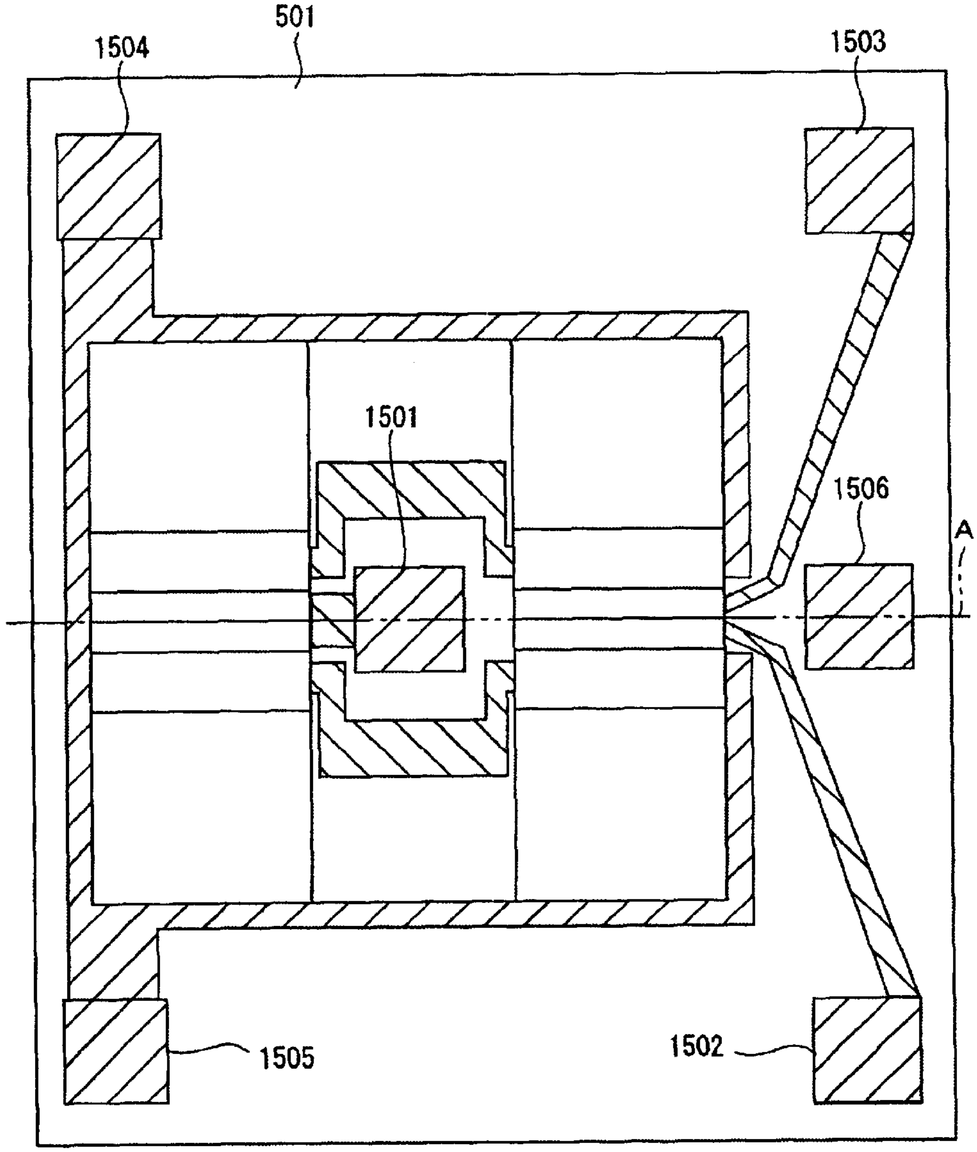
FIG. 29 is a plan showing another example layout on the piezoelectric substrate in a case in which the electrode structure shown in FIG. 2 is mounted to the package having the electrode terminals at the rear surface side, shown in FIG. 20.

FIG. 26 and FIG. 27 show example layouts on the piezoelectric substrate 501, used with the electrode structure shown in FIG. 2 when the package having five electrode terminals shown in FIG. 6 is used. FIG. 28 and FIG. 29 show example layouts on the piezoelectric substrate 501, used with the electrode structure shown in FIG. 2 when the package having six electrode terminals shown in FIG. 20 is used.

Electrode pads 1201, 1301, 1401, and 1502 are connected to unbalanced signal terminals, electrode pads 1202, 1203, 1302, 1303, 1401, 1403, 1502, and 1503 are connected to balanced signal terminals, and the remaining electrode pads are connected to ground terminals.

In the first preferred embodiment, a 40±5-degree Y-cut X-propagation $LiTaO_3$ substrate is preferably used as the piezoelectric substrate 501. The present invention is not limited to this piezoelectric substrate 501. With other piezoelectric substrates, such as 64 to 72-degree Y-cut X-propagation $LiNbO_3$ substrates and a 41-degree Y-cut X-propagation $LiNbO_3$ substrate, the same advantages are obtained.

A communication apparatus in which a surface acoustic wave apparatus according to one of the first preferred embodiment and modifications of the first preferred embodiment of the present invention, or a combination thereof, is provided will now be described with reference to FIG. 30.

Figure 30:
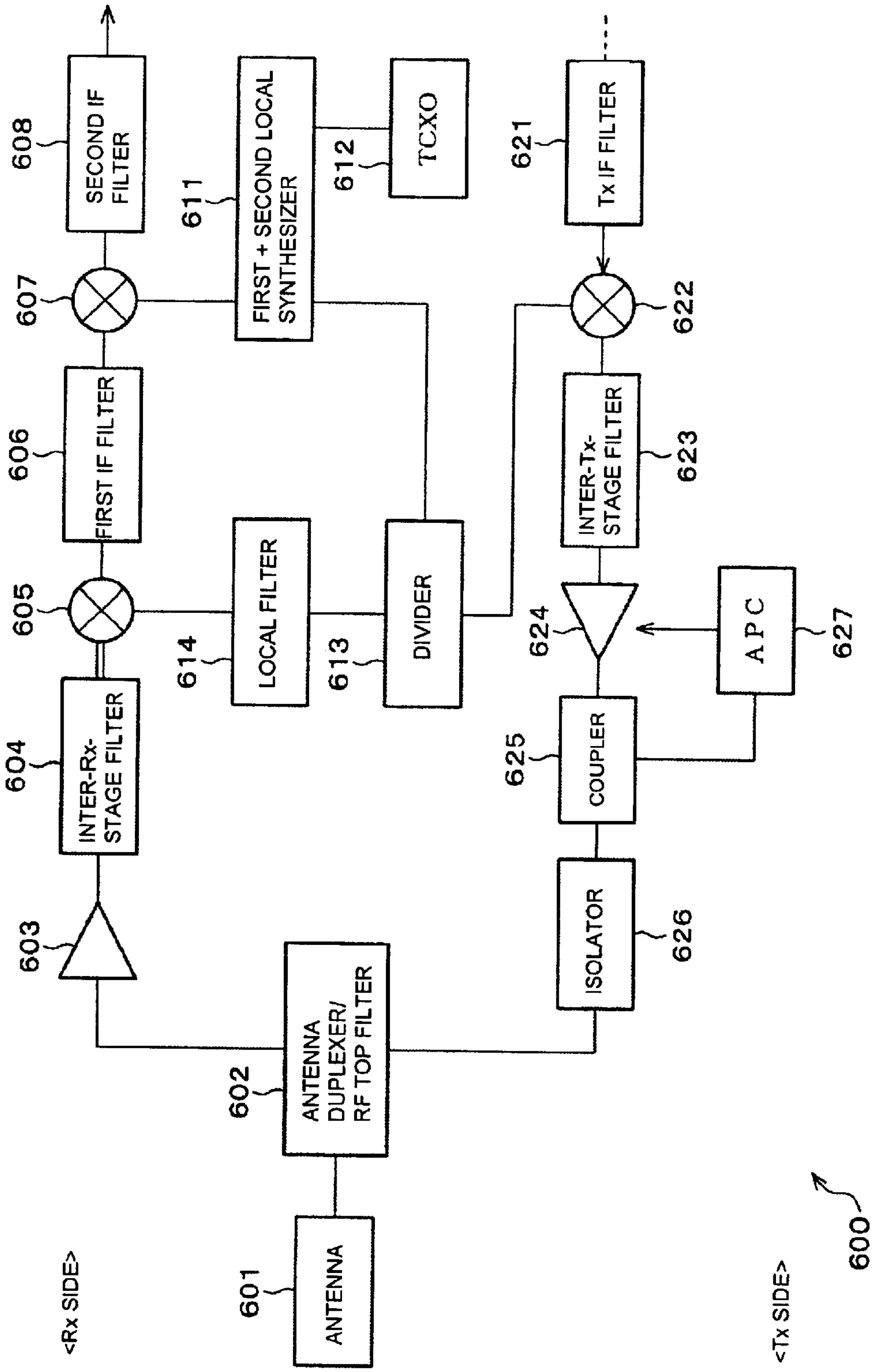
FIG. 30 is a block diagram showing main sections of a communication apparatus according to a preferred embodiment of the present invention.

As shown in FIG. 30, the communication apparatus 600 preferably includes in a receiver side (Rx side) for receiving, an antenna 601, an antenna duplexer/RF top filter 602, an amplifier 603, an inter-Rx-stage filter 604, a mixer 605, a first IF filter 606, a mixer 607, a second IF filter 608, a first+second local synthesizer 611, a temperature compensated crystal oscillator (TCXO) 612, a divider 613, and a local filter 614. It is preferred that balanced signals be transmitted from the inter-Rx-stage filter 604 to the mixer 605 in order to maintain balance, as indicated by a doubled line in FIG. 30.

The communication apparatus 600 also includes in a transceiver side (Tx side) for transmission, the antenna 601 and the antenna duplexer/RF top filter 602, both of which are shared with, a Tx IF filter 621, a mixer 622, an inter-Tx-stage filter 623, an amplifier 624, a coupler 625, an isolator 626, and an automatic power control (APC) 627.

The surface acoustic wave apparatus according to the present preferred embodiment described above are suitably used for the inter-Rx-stage filter 604, the first IF filter 606, the Tx IF filter 621, the inter-Tx-stage filter 623, and the antenna duplexer/RF top filter 602.

A surface acoustic wave apparatus according to the preferred embodiments of the present invention has a balanced-to-unbalanced conversion function as well as a filter function, and also has outstanding characteristics in which the amplitude characteristic and the phase characteristic between balanced signals are closer to the ideal characteristics. Therefore, a communication apparatus according to the present invention, having the above-described surface acoustic wave apparatuses included therein has a reduced number of components, a reduced size, and a greatly improved transfer characteristic.

The present invention is not limited to each of the above-described preferred embodiments, and various modifications are possible within the range described in the claims. An embodiment obtained by appropriately combining technical means disclosed in each of the different preferred embodiments is included in the technical scope of the present invention.

What is claimed is:

1. A surface acoustic wave apparatus comprising:

a longitudinally-coupled-resonator-type surface acoustic wave filter in which an odd number of at least three interdigital transducers are provided on a piezoelectric substrate in a direction in which surface acoustic waves propagate, one interdigital electrode of an interdigital transducer of said at least three interdigital transducers that is disposed at the approximate center of the at least three interdigital transducers is divided into two parts along the propagation direction of title surface acoustic waves and the two parts are connected to balanced signal terminals, and two interdigital transducers of the at least three interdigital transducers that are adjacent to the interdigital transducer disposed at the approximate center are arranged to be inverted with respect to each other and are connected to an unbalanced signal terminal to have a balanced-to-unbalanced conversion function; wherein an outermost electrode finger of the interdigital transducer disposed at the approximate center is a floating electrode or a grounded electrode, and wiring is arranged asymmetrically such that one of the balanced signal terminals that is closer to one of the two interdigital transducers adjacent to the interdigital transducer disposed at the approximate center and of which an outermost electrode finger adjacent to the interdigital transducer disposed at the approximate center is grounded, has a relatively larger capacitance than another of the balanced terminals.

2. A communication apparatus comprising the surface acoustic wave apparatus according to claim 1.

3. A surface acoustic wave apparatus according to claim 1, wherein the piezoelectric substrate is mounted on a package by flip-chip bonding, and the asymmetrical wiring is provided on the package.

4. A surface acoustic wave apparatus according to claim 1, wherein wiring on the piezoelectric substrate and on the package is arranged substantially symmetrically about a virtual axis that is substantially perpendicular to the propagation direction of the surface acoustic waves at the center of the interdigital transducer disposed at the approximate center, except for the asymmetrical wiring.

5. A surface acoustic wave apparatus according to claim 1, wherein a surface acoustic wave resonator is arranged in series or in parallel to the surface acoustic wave filter.

6. A surface acoustic wave apparatus according to claim 1, wherein a plurality of the surface acoustic wave filters are connected in cascade to each other.

7. A surface acoustic wave apparatus according to claim 6, wherein the total number of the electrode fingers of the surface acoustic wave filters connected in cascade is an even number.

8. A surface acoustic wave apparatus according to claim 6, wherein interdigital transducers located at both ends of each of the surface acoustic wave filters connected in cascade to each other are connected to interdigital transducers positioned at both ends of another, by signal lines, and the phases of signals passing through the signal lines are different by about 180 degrees.

9. A surface acoustic wave apparatus according to claim 1, wherein an electrode finger of at least one interdigital transducer of adjacent interdigital transducers close to a boundary between the interdigital transducers is weighted in the surface acoustic wave filter.

10. A surface acoustic wave apparatus according to claim 9, wherein the weighting is series weighting.

11. A surface acoustic wave apparatus according to claim 1, wherein the piezoelectric substrate is mounted on a package and flip-chip bonded thereto, the package includes six external terminals, one unbalanced signal terminal, two balanced signal terminals, and three ground terminal, and the six terminals are arranged substantially symmetrically about a virtual axis that is substantially perpendicular to the propagation direction of the surface acoustic waves at the center of the interdigital transducer positioned at the approximate center of the surface acoustic wave filter.

12. A surface acoustic wave apparatus according to claim 1, wherein the piezoelectric substrate is mounted on a package and flip-chip bonded thereto, the package has five external terminals, one unbalanced signal terminal, two balanced signal terminals, and two ground terminals, are the five terminals are arranged substantially symmetrically about a virtual axis that is substantially perpendicular to the propagation direction of the surface acoustic waves at the center of the interdigital transducer positioned at the approximate center of the surface acoustic wave filter.

13. A surface acoustic wave apparatus comprising:

a longitudinally-coupled-resonator-type surface acoustic wave filter in which an odd number of at least three interdigital transducers are provided on a piezoelectric substrate in a direction in which surface acoustic waves propagate, one interdigital electrode of an interdigital transducer of said at least three interdigital transducers that is disposed at the approximate center of the at least three interdigital transducers is divided into two parts along the propagation direction of the surface acoustic waves and the two parts are connected to balanced signal terminals, and two interdigital transducers of the at least three interdigital transducers that are adjacent to the interdigital transducer disposed at the approximate center are arranged to be inverted with respect to each other and are connected to an unbalanced signal terminal to have a balanced-to-unbalanced conversion function; wherein an outermost electrode finger of the interdigital transducer disposed at the approximate center is a signal electrode; and wiring is arranged asymmetrically such that one of the balanced signal terminals that is closer to one of the two interdigital transducers adjacent to the interdigital transducer disposed at the approximate center and of which an outermost electrode finger adjacent to the interdigital transducer disposed at the approximate center is grounded, has a relatively larger capacitance than another of the balanced terminals.

14. A surface acoustic wave apparatus comprising:

a longitudinally-coupled-resonator-type surface acoustic wave filter in which an odd number of at least three interdigital transducers are provided on a piezoelectric substrate in a direction in which surface acoustic waves propagate, one interdigital electrode of an interdigital transducer of said at least th three interdigital transducers that is disposed at the approximate center of the at least three interdigital transducers is divided into two parts along the propagation direction of surface acoustic waves and the two parts are connected to balanced signal terminals, and two interdigital transducers of the at least three interdigital transducers that are adjacent to the interdigital transducer disposed at the approximate center are arranged to be inverted with respect to each other and are connected to an unbalanced signal terminal to have a balanced-to-unbalanced conversion function; wherein an outermost electrode finger of the interdigital transducer disposed at the center is a floating electrode or a grounded electrode; and at least one of a reactance component and a delay line is added between a ground potential and one of the balanced signal terminals that is closer to an interdigital transducer of the two interdigital transducers adjacent to the interdigital transducer disposed at the center and of which an outermost electrode finger adjacent to the interdigital transducer disposed at the approximate center is grounded.

15. A surface acoustic wave apparatus according to claim 14, wherein the piezoelectric substrate is mounted on a package by flip-chip bonding, and the at least one of the reactance component and the delay line is provided on the package.

16. A surface acoustic wave apparatus according to claim 15, wherein wiring on the piezoelectric substrate and on the package is arranged substantially symmetrically about a virtual axis that is substantially perpendicular to the propagation direction of the surface-acoustic waves at the center of the interdigital transducer disposed at the approximate center, except for the at least one of the reactance component and the delay line.

17. A surface acoustic wave apparatus according to claim 14, wherein the reactance component is an inductance component, and is connected in series to said one of the balanced signal terminals.

18. A surface acoustic wave apparatus comprising:

a longitudinally-coupled-resonator-type surface acoustic wave filter in which an odd number of at least three interdigital transducers are provided on a piezoelectric substrate in a direction in which surface acoustic waves propagate one interdigital electrode of an interdigital transducer of said at least three interdigital transducers that is disposed at the approximate center of the at least three interdigital transducers is divided into two parts along the propagation direction of the surface acoustic waves and the two parts are connected to balanced signal terminals, and two interdigital transducers of the at least three interdigital transducers that are adjacent to the interdigital transducer disposed at the approximate center are arranged to be inverted with respect to each other and are connected to an unbalanced signal terminal to have a balanced-to-unbalanced conversion function; wherein an outermost electrode finger of the interdigital transducer disposed at the center is a signal electrode; and at least one of a reactance component and a delay line is added between a ground potential and one of the balanced signal terminal that is closer to an interdigital transducer of the two interdigital transducers adjacent to the interdigital transducer disposed at the center and of which an outermost electrode finger adjacent to the interdigital transducer disposed at the approximate center is grounded.

19. A surface acoustic wave apparatus comprising:

at least two longitudinally-coupled-resonator-type surface acoustic wave filters that are cascade connected to one another, each of said at least two longitudinally-coupled-resonator-type surface acoustic wave filters include an odd number of at least three interdigital transducers that are arranged on a piezoelectric substrate in a direction in which surface acoustic waves propagate, one interdigital electrode of an interdigital transducer of said at least three interdigital transducers that is disposed at the approximate center of the at least three interdigital transducer is divided into two parts along the propagation direction of the surface acoustic waves and the two parts are connected to balanced signal terminals; wherein an outermost electrode finger of the interdigital transducer disposed at the center is a floating electrode or a grounded electrode; and at least one of a reactance component and a delay line is added between a ground potential and one of the balanced signal terminals that is closer to an interdigital transducer of the two interdigital transducers adjacent to the interdigital transducer disposed at the center and of which an outermost electrode finger adjacent to the interdigital transducer disposed at the approximate center is grounded.

20. A surface acoustic wave apparatus according to claim 19, wherein the piezoelectric substrate is mounted on a package by flip-chip bonding, and the at least one of the reactance component and the delay line is provided on the package.

21. A surface acoustic wave apparatus according to claim 20, wherein wiring on the piezoelectric substrate and on the package is arranged substantially symmetrically about a virtual axis that is substantially perpendicular to the propagation direction of the surface-acoustic waves at the center of the interdigital transducer disposed at the approximate center, except for the at least one of the reactance component and the delay line.

22. A surface acoustic wave apparatus according to claim 19, wherein the reactance component is an inductance component, and is connected in series to said one of the balanced signal terminals.

* * * * *